(12) United States Patent
Cho et al.

(10) Patent No.: US 12,217,804 B2
(45) Date of Patent: Feb. 4, 2025

(54) NONVOLATILE MEMORY DEVICE INCLUDING COMBINED SENSING NODE AND CACHE READ METHOD THEREOF

(71) Applicant: Samsung Electronics Co., Ltd., Suwon-si (KR)

(72) Inventors: Yongsung Cho, Suwon-si (KR); Min-Hwi Kim, Suwon-si (KR); Hosang Cho, Suwon-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 169 days.

(21) Appl. No.: 17/960,630

(22) Filed: Oct. 5, 2022

(65) Prior Publication Data

US 2023/0230640 A1    Jul. 20, 2023

(30) Foreign Application Priority Data

Jan. 18, 2022  (KR) .................. 10-2022-0007354
May 3, 2022   (KR) .................. 10-2022-0054806

(51) Int. Cl.
*G11C 16/26*      (2006.01)
*G11C 16/04*      (2006.01)

(52) U.S. Cl.
CPC .......... *G11C 16/26* (2013.01); *G11C 16/0483* (2013.01)

(58) Field of Classification Search
CPC .............. G11C 16/26; G11C 16/0483; G11C 2211/5642; G11C 2211/5643; G11C 11/5642; G11C 16/08; G11C 16/24; G11C 16/32; G11C 29/021; G11C 29/028; G06F 2212/1016; G06F 2212/1032; G06F 2212/1041; G06F 2212/1056; G06F 2212/7203; G06F 12/0238; G06F 12/0215

See application file for complete search history.

(56) References Cited

U.S. PATENT DOCUMENTS

| | | |
|---|---|---|
| 7,679,133 B2 | 3/2010 | Son et al. |
| 8,553,466 B2 | 10/2013 | Han et al. |
| 8,559,235 B2 | 10/2013 | Yoon et al. |
| 8,654,587 B2 | 2/2014 | Yoon et al. |
| 9,543,026 B2 | 1/2017 | Song et al. |
| 10,163,518 B2 | 12/2018 | Yoon et al. |

(Continued)

OTHER PUBLICATIONS

Extended European Search Report issued Jun. 12, 2023 in European Application No. 23150930.8.

*Primary Examiner* — Mohammed A Bashar
(74) *Attorney, Agent, or Firm* — Harness, Dickey & Pierce, P.L.C.

(57) ABSTRACT

A cache read method of a nonvolatile memory device including a plurality of page buffer units and cache latches, each page buffer units having a sensing latch and a sensing node line is provided. The method comprises performing a first on-chip valley search (OVS) read on a selected memory cell using a first sensing node line and a first sensing latch of a first page buffer unit of the plurality of page buffer units; storing first data sensed from the selected memory cell in the first sensing latch, the first data based on a result of the first OVS read; dumping the first data to sensing node lines of at least one page buffer unit, excluding the first page buffer unit, from among the plurality of page buffer units; and performing a second OVS read on the selected memory cell using the first sensing latch.

20 Claims, 16 Drawing Sheets

(56) References Cited

U.S. PATENT DOCUMENTS

| | | | |
|---|---|---|---|
| 10,276,244 B2 | 4/2019 | Iwasaki et al. | |
| 10,324,629 B2 | 6/2019 | Lee et al. | |
| 10,373,691 B2 | 8/2019 | Jung | |
| 10,629,259 B2 | 4/2020 | Jang | |
| 10,720,207 B2 | 7/2020 | Cho et al. | |
| 2011/0233648 A1 | 9/2011 | Seol et al. | |
| 2015/0378887 A1 | 12/2015 | Lee et al. | |
| 2019/0385674 A1 | 12/2019 | Cho et al. | |
| 2020/0159464 A1* | 5/2020 | Park | H03M 13/1111 |
| 2021/0005268 A1* | 1/2021 | Kim | G11C 11/5671 |
| 2021/0005271 A1* | 1/2021 | Shin | G11C 11/5642 |
| 2021/0072922 A1 | 3/2021 | Shin et al. | |

\* cited by examiner

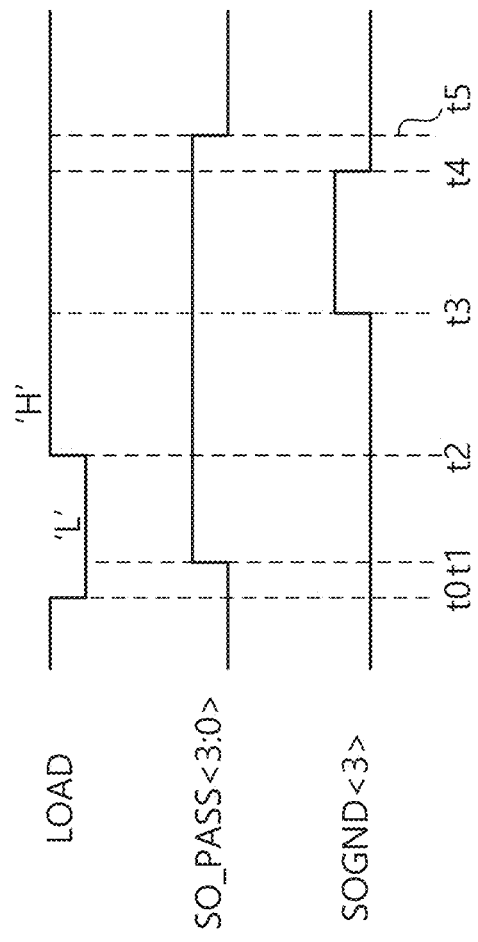

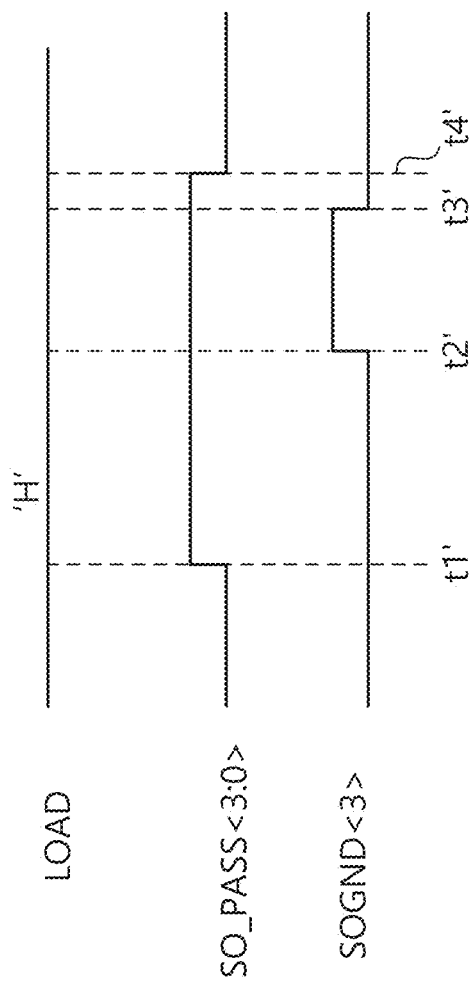

NONVOLATILE MEMORY DEVICE INCLUDING COMBINED SENSING NODE AND CACHE READ METHOD THEREOF

CROSS-REFERENCE TO RELATED APPLICATIONS

This application claims priority under 35 U.S.C. § 119 to Korean Patent Application No. 10-2022-0007354 filed on Jan. 18, 2022, and Korean Patent Application No. 10-2022-0054806 filed on May 3, 2022, in the Korean Intellectual Property Office, the disclosures of which are incorporated by reference herein in their entireties.

BACKGROUND

Example embodiments of the inventive concepts relate to a semiconductor memory device, and more particularly, to a nonvolatile memory device having a combined sensing node and a cache reading method thereof.

Recently, with the multi-functionalization of information and communication devices, there is a demand for increasing the capacity and high integration of semiconductor memory devices. A semiconductor memory device includes a write driver for writing data and a sense amplifier for reading data. In particular, the nonvolatile memory device that stores data even after power is removed may include a page buffer having functions of a write driver and a sense amplifier.

The page buffer includes a plurality of latches for temporarily storing data to be written to the memory cell and/or data sensed from the memory cell. In order to improve the reliability or performance of the page buffer, the number of such latches can be increased. However, as the number of latches increases, the chip area increases and the cost increases. Accordingly, there is a need for a technique capable of improving the performance and/or reliability of the page buffer without increasing the chip area and/or the number of latches.

SUMMARY

Some embodiments of the present disclosure provide a nonvolatile memory device capable of providing high data reliability or performance without adding a latch by utilizing the capacity of a sensing node, and a method of reading a cache thereof.

According to an embodiment of the inventive concepts, a cache read method of a nonvolatile memory device including a memory cell array, a plurality of page buffer units, and cache latches, each of the plurality of page buffer units having a sensing latch and a sensing node line, the method comprising: performing a first on-chip valley search (OVS) read on a selected memory cell using a first sensing node line and a first sensing latch of a first page buffer unit of the plurality of page buffer units; storing first data sensed from the selected memory cell in the first sensing latch, the first data based on a result of the first OVS read; dumping the first data to sensing node lines of at least one page buffer unit, excluding the first page buffer unit, from among the plurality of page buffer units; and performing a second OVS read on the selected memory cell using the first sensing latch.

According to an embodiment of the inventive concepts, a nonvolatile memory device comprising, a cell array comprising: a plurality of memory cells serially coupled to bit lines, a page buffer circuit including a plurality of page buffer units configured to program or sense at least one of the plurality of memory cells through the bit lines and electrically connect or block adjacent sensing node lines in response to a pass control signal, and a control circuit configured to move first data corresponding to a first state sensed through a first sensing node line in a first sensing latch of a first page buffer unit to a second sensing node line of a second page buffer unit during a cache read operation, and to control the page buffer circuit such that the first sensing latch performs an on-chip valley search (OVS) for reading a second state of the first sensing node line.

According to an embodiment of the inventive concepts, a method of cache read method of a nonvolatile memory device, comprising: storing first data in a sensing latch of a first page buffer unit, the first data sensed from a selected memory cell; dumping the first data to a sensing node line of a second page buffer unit; and performing an on-chip valley search (OVS) on the selected memory cell using the sensing latch.

BRIEF DESCRIPTION OF THE FIGURES

The above and other objects and features of the present disclosure will become apparent by describing, in detail, example embodiments thereof with reference to the accompanying drawings.

FIGS. 14A and 14B are waveform diagrams illustrating a data movement process of the page buffer unit PBU3$a$ according to at least one embodiment of the present invention.

DETAILED DESCRIPTION

Figure 1:
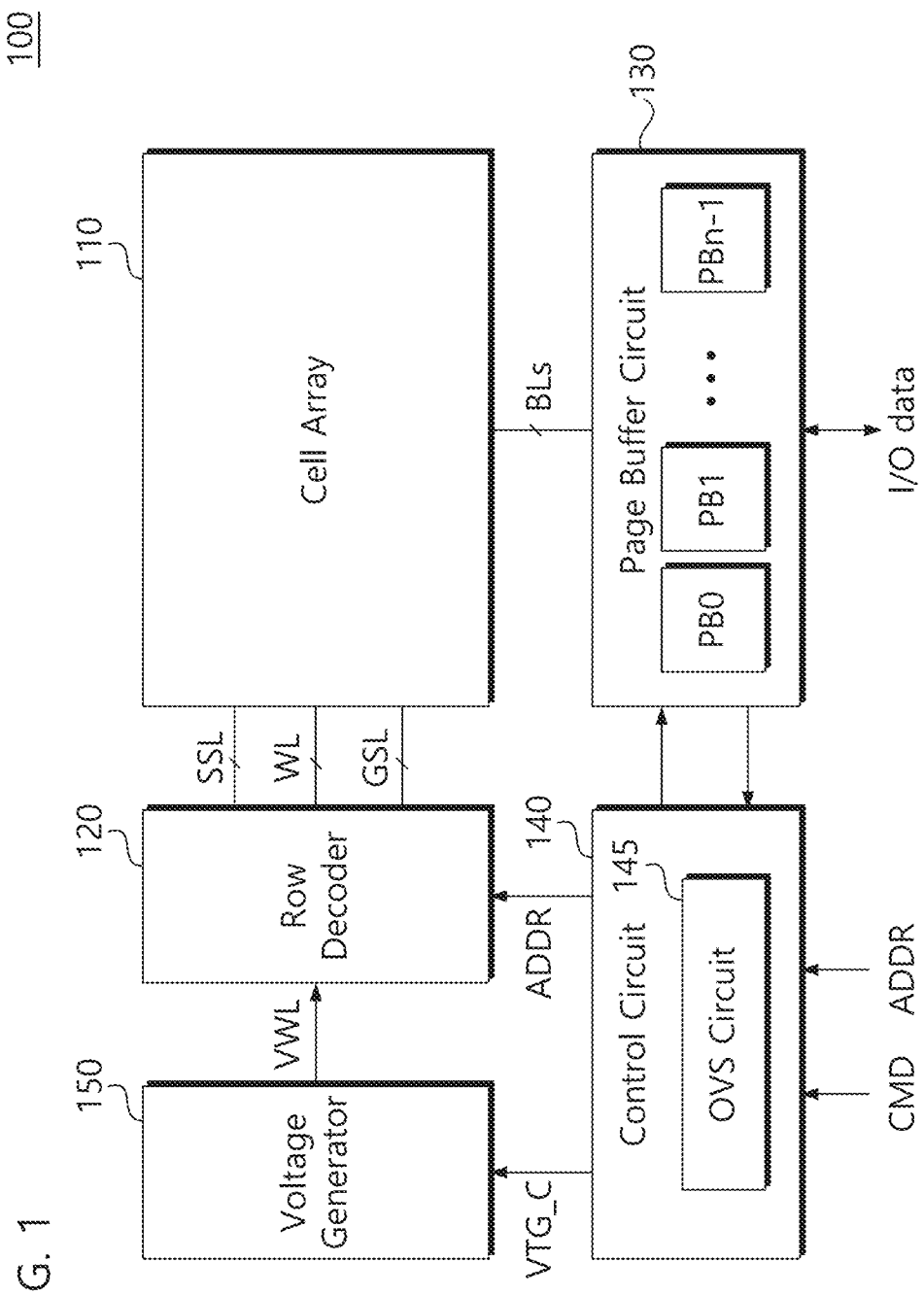
FIG. 1 is a block diagram illustrating a nonvolatile memory device according to at least one embodiment of the present invention.

It is to be understood that both the foregoing general description and the following detailed description are example, and it is to be considered that an additional description of the claimed invention is provided. As used herein, the term "and/or" includes any and all combinations of one or more of the associated listed items. Reference signs are indicated in example embodiments of the present invention, examples of which are indicated in the reference drawings. Wherever possible, the same reference numbers are used in the description and drawings to refer to the same or like parts. Functional elements in the following description and the corresponding blocks shown in the drawings, unless indicated otherwise, may be implemented in processing circuitry such as hardware, software, or a combination thereof configured to perform a specific function. For example, the processing circuitry more specifically may include electrical components such as at least one of transistors, resistors, capacitors, etc. and/or may include electrical components such as logic gates including at least one of AND gates, OR gates, NOR gates, NAND gates, NOT gates, XOR gates, etc.

Spatially relative terms, such as "horizontal," "vertical," "above," and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, the device may be otherwise oriented (rotated 90 degrees or at other orientations) and the spatially relative descriptors used herein interpreted accordingly.

FIG. 1 is a block diagram illustrating a nonvolatile memory device according to at least one embodiment of the present invention. Referring to FIG. 1, the nonvolatile memory device 100 may include a cell array 110, a row decoder 120, a page buffer circuit 130, a control circuit 140, and a voltage generator 150.

The cell array 110 is connected to the row decoder 120 through word lines WLs and through selection lines SSL and GSL. The cell array 110 is connected to the page buffer circuit 130 through bit lines BLs. In at least one embodiment, the cell array 110 may include a plurality of NAND cell strings. A channel of each of the cell strings may be formed in a vertical or horizontal direction. The cell array 110 of the present invention may include a plurality of memory cells forming a cell string. The plurality of memory cells may be programmed, erased, and/or sensed by a voltage applied to the bit line BLs or the word line WLs. The program operation may be performed in units of pages, and the erase operation may be performed in units of the illustrated blocks BLK0 to BLKi.

In at least one embodiment of the present invention, the cell array 110 may be provided as a three-dimensional memory array. For example, the three-dimensional memory array may be formed monolithically on one or more physical levels of an array of memory cells having an active area disposed over a silicon substrate and circuitry associated with operation of the memory cells. Circuitry involved in the operation of the memory cells may be located in or on the substrate. The term 'monolithic' means that the layers of each level of the three-dimensional array are deposited directly over the layers of the lower level of the three-dimensional array.

In at least one embodiment of the present invention, the 3D memory array has vertical directionality, and includes vertical NAND strings in which at least one memory cell is positioned on another memory cell. At least one memory cell includes a charge trap layer. Each vertical NAND string may include at least one select transistor positioned over memory cells. The at least one selection transistor may have the same structure as the memory cells and may be monolithically formed together with the memory cells.

A configuration in which a three-dimensional memory array may be composed of a plurality of levels, has word lines or bit lines shared between the levels, and is suitable for a three-dimensional memory array is disclosed in U.S. Pat. Nos. 7,679,133, 8,553,466, 8,654,587, 8,559,235, and U.S. Patent Publication No. 2011/0233648, which are incorporated herein by reference.

The row decoder 120 may select one of the memory blocks of the cell array 110 in response to an address ADDR. The row decoder 120 may select one of the word lines of the selected memory block in response to the address ADDR. The row decoder 120 transfers the voltage VWL corresponding to the operation mode to the word line of the selected memory block. During the program operation, the row decoder 120 transfers the program voltage Vpgm and the verify voltage Vfy to the selected word line and the pass voltage Vpass to the unselected word line. During a read operation, the row decoder 120 transfers the read voltage Vrd to the selected word line and the read pass voltage Vread to the unselected word line.

The page buffer circuit 130 operates as a write driver or a sense amplifier. For example, during a program operation, the page buffer circuit 130 transfers a bit line voltage corresponding to data to be programmed to the bit lines BLs of the cell array 110; and during a read operation or a verify read operation, the page buffer circuit 130 senses data stored in the selected memory cell through the bit lines BLs.

Each of the plurality of page buffers PB0 to PBn−1 may perform sensing and data latch functions for performing an on-chip valley search (hereinafter, OVS) operation. That is, each of the plurality of page buffers PB0 to PBn−1 may perform an OVS read operation using different read voltages (and/or bit line development times) to identify an optimal read level under the control of the on-chip valley search OVS circuit 145. In addition, the plurality of page buffers PB0 to PBn−1 may perform fine sensing for the corresponding memory cell based on the optimal read voltage (and/or bit line development time) determined according to the result of the OVS read operation.

Each of the plurality of page buffers PB0 to PBn−1 includes a page buffer unit PBU and a cache unit CU. Page buffer units (e.g., PBU0 to PBUn−1 in FIG. 4) and cache units (e.g., CU0 to CUn−1 in FIG. 4) included in the plurality of page buffers PB0 to PBn−1 may have a separate structure (e.g., may be spaced apart from each other). The sensing nodes SO of each of the plurality of page buffers PB0 to PBn−1 may be commonly connected to the common sensing node SOC. Also, the cache units CU0 to CUn−1 may be commonly connected to the common sensing node SOC. Accordingly, the plurality of page buffer units PBU0 to PBUn−1 may be connected to the cache units CU0 to CUn−1 through the common sensing node SOC. Based on this structure, the degree of freedom for the wirings disposed on the page buffer units PBU0 to PBUn−1 may be improved and the complexity of the layout may be reduced. In addition, the cache units CU0 to CUn−1 are disposed adjacent to the data input/output lines, so that the distance between the cache latch (hereinafter, CL) and the data input/output line is reduced, thereby improving the data input/output speed. Sensing operation, latching operation, and selecting operation of the plurality of page buffers PB0 to PBn−1 will be described in example embodiments with reference to the drawings to be described later.

Each page buffer unit PBU0 to PBUn−1 included in the plurality of page buffers PB0 to PBn−1 may include a pair of pass transistors (e.g., PT_U and PT_D in FIG. 5) and a sensing node SO line for connecting the pair of pass transistors to each other. In this case, the sensing node line may be implemented as one track of the lower metal layer and may correspond to the sensing node SO. During the data sensing period, the pass transistors PT_U and PT_D respectively included in the plurality of page buffer units may be electrically cut off from each other. Accordingly, sensing node lines of each of the plurality of page buffer units may be electrically cut off from each other. On the other hand, during the data transfer period, the pass transistors PT_U and PT_D included in the plurality of page buffer units may be turned on. Accordingly, sensing node lines included in each of the plurality of page buffer units are electrically connected to each other, and thus may be used as data transfer lines. Hereinafter, the structure of such a sensing node line will be referred to as a combined sensing node (C_SO).

In addition, the page buffer circuit 130 of the present invention may perform a full on-chip valley search (Full OVS) on stored data even during a cache read operation performed in the program suspend period. For example, the program suspend is executed by a program suspend command for suspending a program operation on one memory block and accessing another memory block. In the program suspend period, the data latches of the page buffers PB0 to PBn−1 are occupied by write data of a previous program operation. In addition, when a cache read command is provided in the program suspend period, cache read data occupies a cache latch C-Latch (hereinafter, CL) of each of the page buffers PB0 to PBn−1. Accordingly, it is generally impossible to perform a full on-chip valley search (Full OVS) for two or more program states with only one sensing latch (S-Latch, hereinafter, SL).

In contrast, in at least one embodiment of the present invention, the sensing node SO lines of the page buffer units, on which on-chip valley search is not performed, are combined to form a combined sensing node C_SO. The combined sensing node C_SO can be used as storage for data dump. Accordingly, the page buffer circuit 130 of the present invention can support a full on-chip valley search (Full OVS) in a cache read operation performed in the program suspend period without an additional latch.

The control circuit 140 controls the page buffer circuit 130, the row decoder 120, and the voltage generator 150 in response to, e.g., a command CMD transmitted from the outside. The control circuit 140 may control the voltage generator 150, the page buffer circuit 130, and/or the row decoder 120 to perform program, read, and/or erase operations on the selected memory cell according to the command CMD. The control circuit 140 may transmit the address ADDR to the row decoder 120 and/or may provide the voltage control signal VTG_C to the voltage generator 150. In at least one example, the control circuit 140 may include an OVS circuit 145 for performing an on-chip valley search OVS operation. The control circuit 140 may control the pass transistors PT_U and PT_D of each of the plurality of page buffer units to perform a full on-chip valley search (Full OVS) in a cache read operation performed in the program suspend period. For example, the control circuit 140 may generate a pass control signal (SO_PASS<i>, i is an integer) or a common pass control signal (SOC_PASS<j>, j is an integer) for forming the combined sensing node C_SO.

The voltage generator 150 generates various types of word line voltages VWL to be supplied to respective word lines and voltage to be supplied to bulk (e.g., well regions) in which memory cells are formed, under the control of the control circuit 140. The word line voltages to be supplied to the respective word lines include a program voltage Vpgm, a pass voltage Vpass, and select and non-select read voltages Vrd and Vread.

Although not shown, the nonvolatile memory device 100 may further include components such as an input/output buffer (I/O buffer) and a mass bit counter (hereinafter, MBC). The nonvolatile memory device 100 according to the present invention forms the combined sensing node C_SO using sensing nodes of a page buffer unit on which on-chip valley search OVS is not performed. And then, the nonvolatile memory device 100 may store data to the combined sensing node C_SO. Accordingly, the page buffer circuit 130 of the present invention can perform a full on-chip valley search (Full OVS) even during a cache read operation (in which the use of the cache latch is not typically possible in the program suspend period) without additional latch. Thus, according to the present invention, it is possible to implement the nonvolatile memory device 100 having high data reliability regardless of the operation mode.

Figure 2:
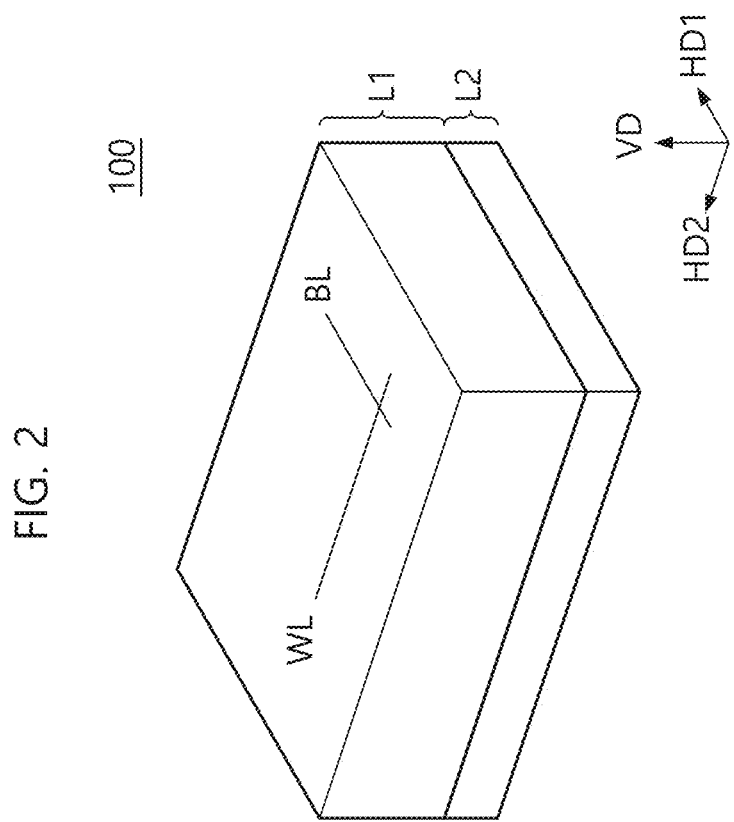
FIG. 2 schematically shows the structure of the nonvolatile memory device of FIG. 1 according to at least one embodiment of the present invention.

FIG. 2 schematically shows the structure of the nonvolatile memory device of FIG. 1 according to at least one embodiment of the present invention. Referring to FIG. 2, the nonvolatile memory device 100 may include a first semiconductor layer L1 and a second semiconductor layer L2, wherein the first semiconductor layer L1 may be stacked in a vertical direction (VD) perpendicular to the second semiconductor layer L2. Specifically, the second semiconductor layer L2 may be disposed below in the vertical direction VD with respect to the first semiconductor layer L1, and accordingly, the second semiconductor layer L2 may be disposed close to the substrate.

In an embodiment, the cell array 110 of FIG. 1 may be formed on the first semiconductor layer L1, and a peripheral circuit corresponding to the row decoder 120, the page buffer circuit 130, the control circuit 140, and the voltage generator 150 of FIG. 1 may be formed in the second semiconductor layer L2. Accordingly, the nonvolatile memory device 100 may have a structure in which the cell array 110 is disposed on the peripheral circuits 120, 130, 140, and 150. The structure may be referred to as a COP (Cell Over Periphery) structure. The COP structure can effectively reduce a horizontal area and improve the degree of integration of the nonvolatile memory device 100.

In at least one embodiment, the second semiconductor layer L2 may include a substrate, and the peripheral circuits 120, 130, 140 and 150 may be formed in the second semiconductor layer L2 by forming transistors and metal patterns for wiring the transistors on the substrate. After the peripheral circuits 120, 130, 140, and 150 are formed on the second semiconductor layer L2, the first semiconductor layer L1 including the cell array 110 may be formed, and Metal patterns for electrically connecting the word lines WL and bit lines BL to the peripheral circuits 120, 130, 140, and 150 formed in the second semiconductor layer L2 may be formed. For example, the bit lines BL may extend in the first horizontal direction HD1, and the word lines WL may extend in the second horizontal direction HD2.

As the semiconductor process develops, as the number of stages of memory cells disposed in the cell array 110 increases (e.g., as the number of stacked word lines WL increases) the area of the cell array 110 decreases, and thus the area of the peripheral circuits 120, 130, 140, and 150 is also reduced. In particular, the nonvolatile memory device 100 utilizes a combined sensing node C_SO to store data of a page buffer unit in which on-chip valley search OVS is not performed. Accordingly, the nonvolatile memory device 100 of the present invention can perform a full OVS (Full OVS) in the program suspend period without additional latches or area increase.

Figure 3:
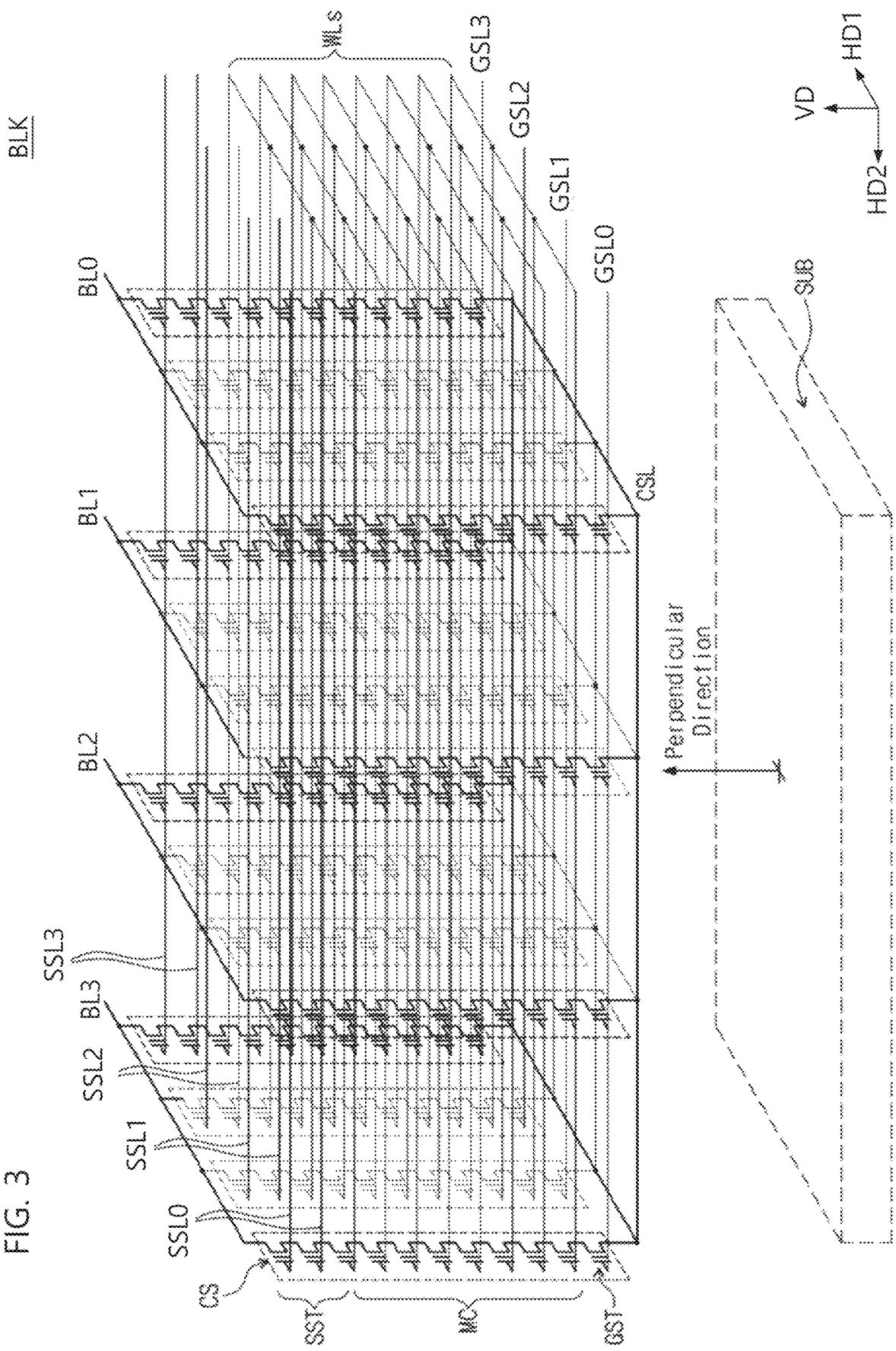
FIG. 3 is a circuit diagram illustrating an example structure of a memory block constituting the cell array of FIG. 2.

FIG. 3 is a circuit diagram illustrating an example structure of a memory block constituting the cell array of FIG. 2. Referring to FIG. 3, cell strings NS are formed between the bit lines BL0, BL1, BL2, and BL3 and the common source line CSL to form the memory block BLK. For example, cell strings (e.g., NS1, NS2, . . . of FIG. 4) may be formed between one of the bit lines (e.g., BL0) and the common source line.

For example, cell strings may be formed between the bit line BL0 and the common source line CSL. For consistency, the cell strings formed between the bit line BL0 and the common source line CSL may be referred to as cell strings NS10, NS20, . . . , but, for clarity of illustration, are not illustrated as such in the figures. A plurality of cell strings NS11, NS21, NS12, NS22, NS13, and NS23 are also formed between the bit lines BL1, BL2, and BL3 and the common source line CSL in the same manner. Each of the cell strings may be further connected a corresponding string selection line SSL0, SSL1, SSL2, etc. through at least one corresponding string select transistor SST. The string select transistor SST of the cell strings NS may be connected to a corresponding bit line BL. The ground selection transistor GST of the cell strings NS may be connected to the common source line CSL. Memory cells MCs are provided between the string select transistor SST and the ground select transistor GST of the cell string NS.

Each of the cell strings NS includes a ground select transistor GST. Ground selection transistors included in the cell strings NS may be controlled by the ground selection line GSL. Alternatively, although not shown, cell strings corresponding to each row may be controlled by different ground selection lines.

A circuit structure of memory cells included in one memory block BLK has been briefly described above. However, the circuit structure of the illustrated memory block is only a simplified structure for convenience of description, and the actual memory block is not limited to the illustrated example. That is, it will be well understood that more semiconductor layers, bit lines BLs, and string selection lines SSLs may be included in one physical block.

Figure 4:
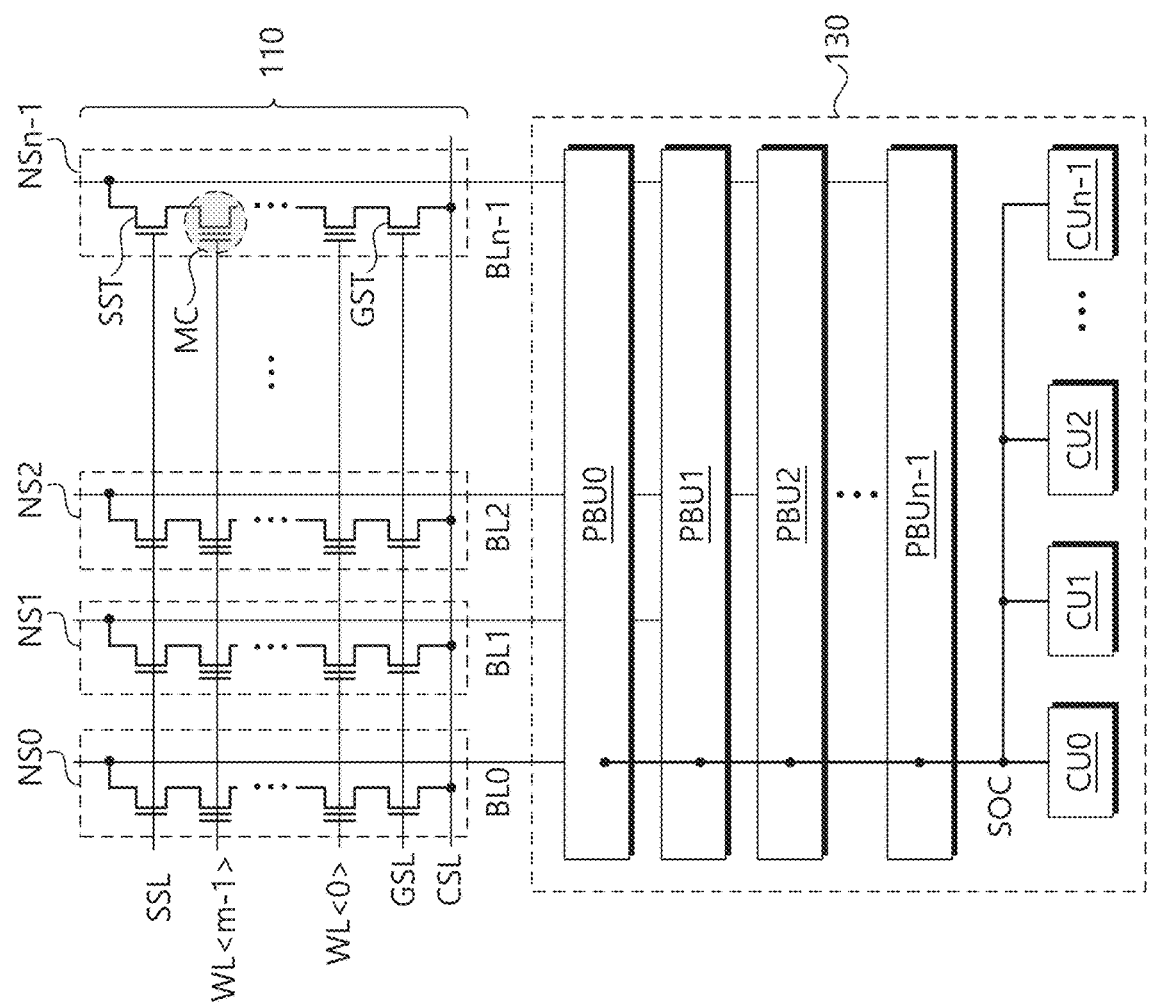
FIG. 4 is a diagram illustrating a connection between a cell array and a page buffer circuit.

FIG. 4 is a diagram illustrating a connection between a cell array and a page buffer circuit. Referring to FIG. 4, the cell array 110 may include a plurality of NAND cell strings NS0 to NSn−1. In addition, the page buffer circuit 130 may include a plurality of page buffer units PBU0 to PBUn−1 and a plurality of cache units CU0 to CUn−1.

Each of the plurality of NAND cell strings NS0 to NSn−1 may include the ground selection transistor GST connected to the ground selection line GSL, a plurality of memory cells MC connected to the word lines WL<0> to WL<m−1>, and a string select transistor SST connected to a string select line SSL. The ground select transistor GST, a plurality of memory cells MC, and the string select transistor SST may be connected in series with each other. Here, is a positive integer.

The page buffer circuit 130 may include a plurality of page buffer units PBU0 to PBUn−1. The first page buffer unit PBU0 is connected to the first NAND string NS0 through the first bit line BL0, and the nth page buffer unit PBUn−1 is connected to the n-th NAND string NSn−1 through the n-th bit line BLn−1. Here, is a positive integer. For example, may be 8, and the page buffer circuit 130 may have a structure in which a plurality of page buffer units (e.g., PBU0 to PBU7) are arranged in a line. Alternatively, in the page buffer circuit 130, the page buffer units PBU0 to PBU3 and the page buffer units PBU4 to PBU7 arranged in a row are symmetrically arranged with respect to the page buffer decoder.

For example, the plurality of page buffer units PBU0 to PBUn−1 may be arranged in a line along the extending direction of the first to n-th bit lines BL0 to BLn−1. The page buffer circuit 130 may further include a plurality of cache units CU0 to CUn−1 respectively corresponding to the plurality of page buffer units PBU0 to PBUn−1. For example, when is 8, the page buffer circuit 130 may have a structure in which eight cache latches CL0 to CL7 are arranged in a row. For example, the plurality of cache units CU0 to CUn−1 may be arranged in a line along the extending direction of the first to n-th bit lines BL0 to BLn−1. The sensing nodes SO of each of the plurality of page buffer units PBU0 to PBUn−1 may be commonly connected to the common sensing node SOC. Also, the plurality of cache units CU0 to CUn−1 may be commonly connected to the common sensing node SOC. Accordingly, the plurality of page buffer units PBU0 to PBUn−1 may be connected to the plurality of cache units CU0 to CUn−1 through the common sensing node SOC.

In the page buffer circuit 130 having the above structure, each of the plurality of page buffer units PBU0 to PBUn−1 may include pass transistors PT_U and PT_D (see FIG. 5) that can connect the sensing node SO to neighboring sensing nodes. In addition, the pass transistors PT_U and PT_D may be serially connected to each other, and accordingly, the sensing nodes included in each of the plurality of page buffer units PBU0 to PBUn−1 may be electrically connected to each other, thereby having capacity to store data. As mentioned above, a sensing node to which one or more sensing nodes of the plurality of page buffer units PBU0 to PBUn−1 is connected is referred to as a combined sensing node C_SO.

In addition, when a cache read operation is being performed in any one of the plurality of page buffer units PBU0 to PBUn−1, data for a cache read operation is stored in a cache latch included in the corresponding cache unit. At this time, by connecting the sensing nodes SOs of the page buffer units that are not in use among the plurality of page buffer units PBU0 to PBUn−1, the combined sensing node C_SO having an appropriate capacity may be formed. The combined sensing node C_SO can be used as a storage medium for full On-Chip Valley Search (Full OVS). The connection of the sensing nodes and the formation of the combined sensing node C_SO can be achieved through the control of the pass transistors PT_U and PT_D. These features will be described in detail with reference to the following drawings.

Figure 5:
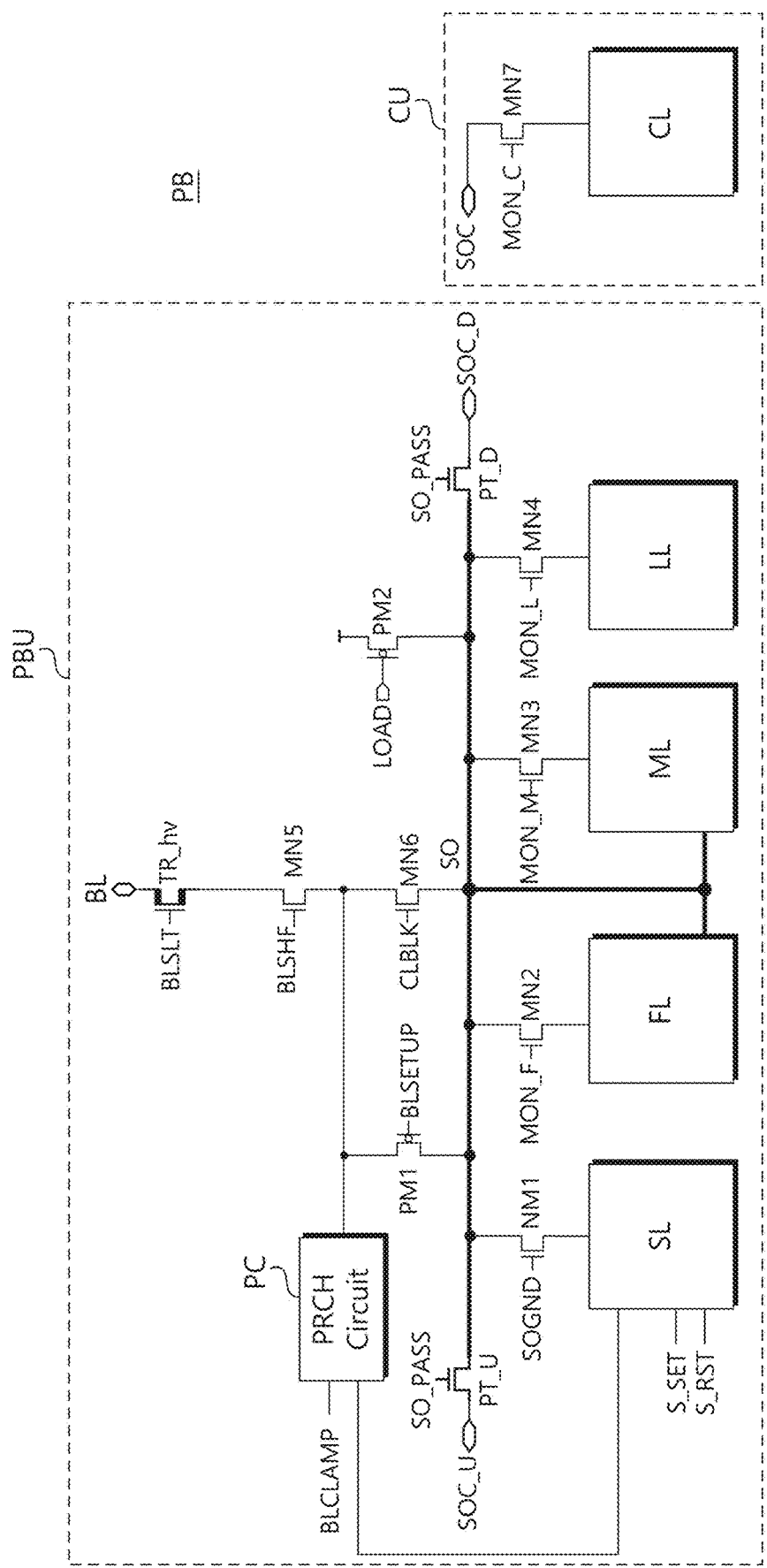
FIG. 5 is a circuit diagram illustrating a page buffer unit and a cache unit constituting a page buffer.

FIG. 5 is a circuit diagram illustrating a page buffer unit and a cache unit constituting a page buffer. Referring to FIG. 5, the page buffer PB may include a page buffer unit PBU and a cache unit CU. The cache unit CU includes a cache latch CL. Since the cache latch CL is connected to the data input/output line, the cache unit CU may be disposed adjacent to the data input/output line. Accordingly, the page buffer unit PBU and the cache unit CU may be disposed to be spaced apart from each other, and the page buffer PB may have a separate structure of the page buffer unit PBU and the cache unit CU.

The page buffer unit PBU may include a bit line select transistor TR_hv connected to the bit line BL and driven by the bit line select signal BLSLT. The bit line select transistor TR_hv may be implemented as a high voltage transistor, and accordingly, the bit line select transistor TR_hv may be disposed in the high voltage region.

The page buffer unit (PBU) includes a sense latch (hereinafter, SL), a forcing latch (hereinafter, FL), a MSB latch (hereinafter, ML) and a LSB latch (hereinafter, LL). During a program operation, data to be programmed are stored in the MSB latch ML, the LSB latch LL, and the cache latch CL. On the other hand, in the program suspend period, data to be programmed is stored in the MSB latch ML, the LSB latch forcing latch FL.

The sensing latch SL may store data stored in a memory cell and/or a sensing result of a threshold voltage of the memory cell during a read or program verify operation. Also, the sensing latch SL may be used to apply a program bit line voltage and/or a program inhibit voltage to the bit line BL during a program operation. The forcing latch FL may be used as a bit line bias means for improving threshold voltage distribution during a program operation. The MSB latch ML, the LSB latch LL, and the cache latch CL may be utilized to store data inputted from the outside during a program operation.

The page buffer unit PBU may further include a precharge circuit PC capable of controlling a precharge operation on the bit line BL or the sensing node SO based on the bit line clamping control signal BLCLAMP. The page buffer unit PBU may further include a transistor PM1 driven by the bit line setup signal BLSETUP.

The page buffer unit PBU may include first to fourth transistors NM1 to NM4. The first transistor NM1 may connect the sensing latch SL and the sensing node SO in response to the ground control signal SOGND. The second transistor NM2 may connect the forcing latch FL and the sensing node SO in response to the forcing monitoring signal MON_F. The third transistor NM3 may connect the MSB latched the sensing node SO in response to the upper bit monitoring signal MON_M. The fourth transistor NM4 may connect the LSB latch LL and the sensing node SO in response to the lower bit monitoring signal MONL.

The page buffer unit PBU may further include fifth and sixth transistors NM5 and NM6 connected in series between the bit line select transistor TV_hv and the sensing node SO. The fifth transistor NM5 may be driven by the bit line shut-off signal BLSHF, and the sixth transistor NM6 may be driven by the bit line connection control signal CLBLK. Also, the page buffer unit PBU may further include a precharge transistor PM2. The precharge transistor PM2 is connected to the sensing node SO and may be driven by the load signal LOAD.

For example, the page buffer unit PBU may further include a pair of pass transistors PT_U and PT_D connected to the sensing node SO. The pass transistors PT_U and PT_D may be driven according to the pass control signal SO_PASS. The first pass transistor PT_U may be connected between the first terminal SOC_U and the sensing node SO, and the second pass transistor PT_D may be connected between the sensing node SO and the second terminal SOC_D. The pass transistors PT_U and PT_D may connect or disconnect the sensing node SO from the sensing node SO' of another page buffer unit PBU' in response to the pass control signal SO_PASS. It has been described that the pass transistors PT_U and PT_D are provided in pairs to be respectively connected to the sensing nodes SO", SO" of the neighboring page buffer units PBU' and PBU'". However, it will be understood that single pass transistor PT may be configured to connect the sensing node SO to the sensing node SO' of the neighboring page buffer unit PBU'.

Here, the page buffer unit PBU may connect one or more sensing nodes SO to form the combined sensing node C_SO, and store data based on the capacity provided by the combined sensing node C_SO. For example, while any one of the plurality of page buffer units PBU performs the on-chip valley search OVS, the remaining unused page buffer units PBUs may be connected by the pass control signal SO_PASS to form the combined sensing node C_SO. In addition, data of the sensing latch SL sensed for the on-chip valley search OVS may be temporarily stored in the combined sensing node C_SO. And when the on-chip valley search OVS is terminated, the data of the combined sensing node C_SO may be restored to the sensing latch SL again. This operation may be particularly useful in the page buffer circuit 130 that performs a cache read operation accompanied by an on-chip valley search OVS during the program suspend period. If a technology utilizing such a combined sensing node (C_SO) is used, on-chip valley search OVS of all data states can be performed even during a cache read operation in the program suspend period.

Figure 6:
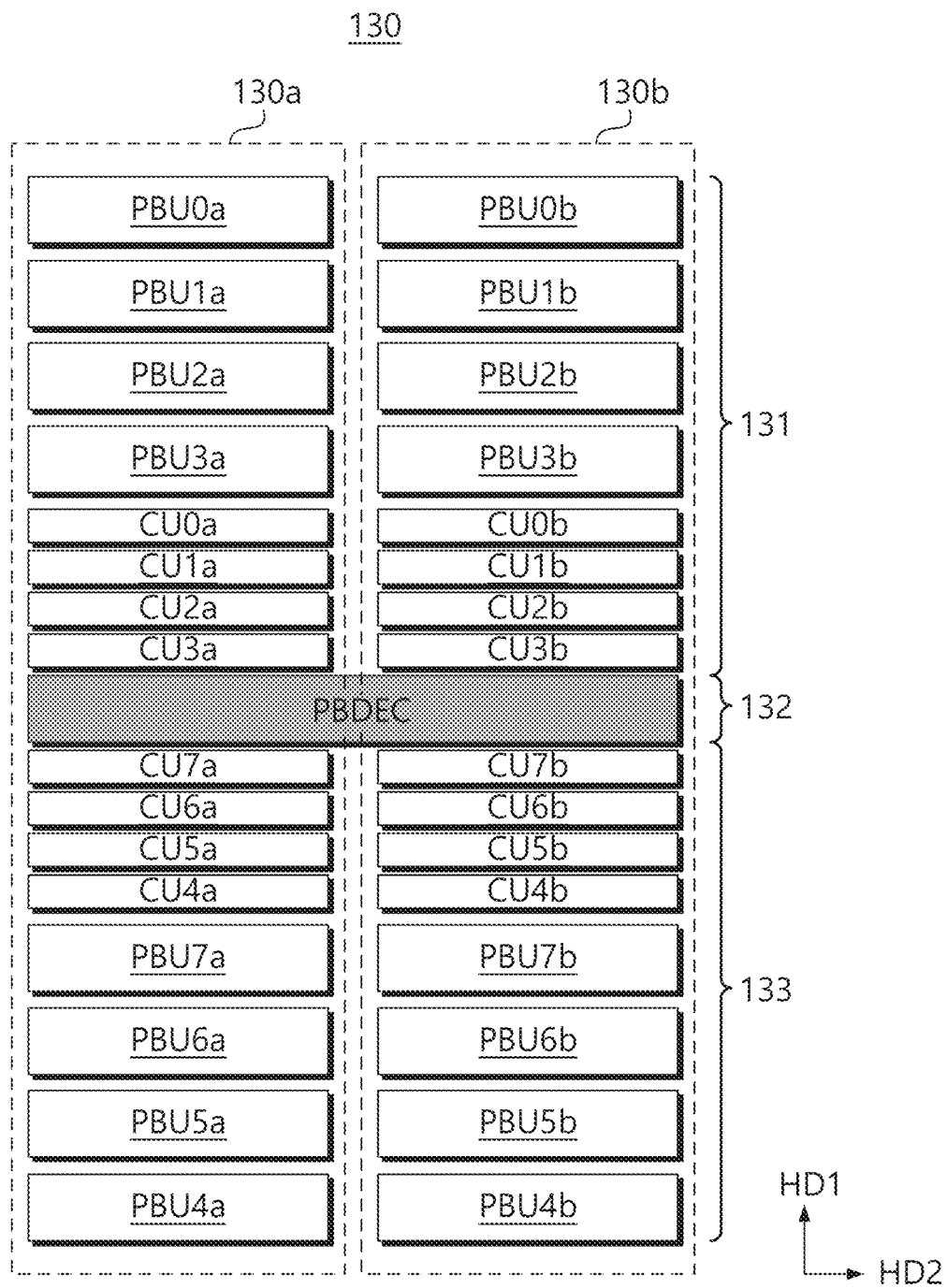
FIG. 6 is a diagram illustrating an arrangement of a page buffer circuit according to an embodiment of the present invention.

FIG. 6 is a diagram illustrating an arrangement of a page buffer circuit according to at least one embodiment of the present invention. Referring to FIG. 6, the page buffer circuit 130 includes a plurality of page buffer columns including a first page buffer column 130a and a second page buffer column 130b disposed along the second horizontal direction HD2. Each of the plurality of page buffer columns 130a and 130b may include a plurality of page buffers arranged in a multi-stage structure.

The first page buffer column 130a may include page buffer units PBU0a to PBU7a, cache units CU0a to CU7a, and a page buffer decoder 132. In particular, the first page buffer column 130a includes page buffer units PBU0a to PBU7a and cache units CU0a to CU7a that are symmetrically arranged with respect to the page buffer decoder 132. That is, the first to fourth page buffer units PBU0a to PBU3a and the fifth to eighth page buffer units PBU4a to PBU7a may be symmetrically arranged with respect to the page buffer decoder 132. In addition, the first to fourth cache units CU0a to CU3a may be symmetrically arranged with the fifth to eighth cache units CU4a to CU7a with respect to the page buffer decoder 132.

The second page buffer column 130b may include page buffer units PBU0b to PBU7b, cache units CU0b to CU7b, and a page buffer decoder 132. For example, the second page buffer column 130b also includes page buffer units PBU0b to PBU7b and cache units CU0b to CU7b that are symmetrically arranged with respect to the page buffer decoder 132.

Each of the first page buffer column 130a and the second page buffer column 130b may be symmetrically disposed with respect to the page buffer decoder 132. For example, each of the first page buffer column 130a and the second page buffer column 130b may be divided into upper page buffers 131 and lower page buffers 133 based on the page buffer decoder 132. A configuration or function of each of the upper page buffers 131 and the lower page buffers 133 is substantially the same. That is, the description of the operation of the upper page buffers 131 is the same and/or substantially equally applied to the operation of the lower page buffers 133.

Each of the page buffer units PBU0a to PBU7a and PBU0b to PBU7b may be implemented the same as and/or substantially similar to the page buffer unit PBU of FIG. 5, and each of the cache units CU0a to CU7a and CU0b to CU7b may be implemented substantially similar to the cache units CU of FIG. 5.

Here, an example in which each of the first page buffer column 130a and the second page buffer column 130b is symmetrically arranged with respect to the page buffer decoder 132 has been described, but the present invention is not limited thereto. For example, the page buffer decoder 132 may be disposed below the first horizontal direction HD1, and eight cache units CU0a to CU7a and CU0b to CU7b may be sequentially disposed above the page buffer decoder 132, and the page buffer units PBU0a to PBU7a and PBU0b to PBU7b may be disposed above the cache units CU0a to CU7a and CU0b to CU7b.

Hereinafter, the configuration of the upper page buffers 131 and the page buffer decoder 132 will be described. For example, these descriptions may be equally applied to the lower page buffers 133 and the page buffer decoder 133.

Figure 7:
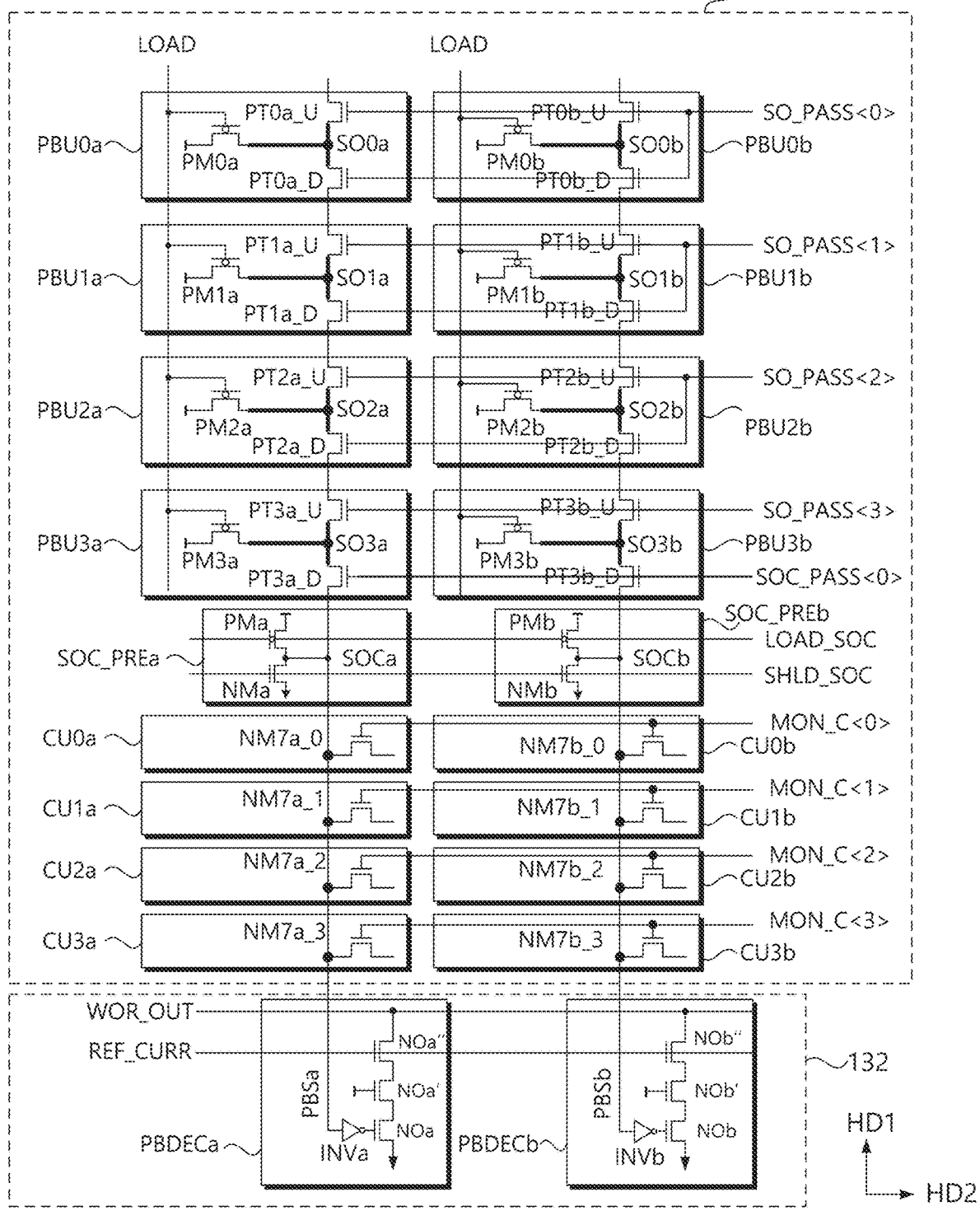
FIG. 7 is a circuit diagram schematically illustrating some configurations of upper page buffers and a page buffer decoder of FIG. 6.

FIG. 7 is a circuit diagram schematically illustrating some configurations of upper page buffers and a page buffer decoder of FIG. 6. Referring to FIG. 7, the page buffer circuit 130 may include upper page buffers 131 and a page buffer decoder 132.

The upper page buffers 131 include a plurality of page buffer units (e.g., PBU0a, PBU1a, PBU2a, and PBU3a) included in the first page buffer column PGBUFa, and a plurality of page buffer units (e.g., PBU0b, PBU1b, PBU2b, and PBU3b) included in the second page buffer column PGBUFb. In the page buffer units arranged in the same row, the sensing node SO may be connected to or blocked from the sensing node SO of a neighboring page buffer unit by the same pass control signal SO_PASS<i>, wherein 'i' is an integer.

The page buffer unit PBU0a may include serially connected pass transistors PT0a_U and PT0a_D, and the page buffer unit PBU0b may include serially connected pass transistors PT0b_U and PT0b_D. A pass control signal SO_PASS<0> may be applied to gates of the pass transistors PT0a_U, PT0a_D, PT0b_U, and PT0b_D. When the pass control signal SO_PASS<0> is activated, the sensing nodes SO0a and SO0b of each of the page buffer units PBU0a and PBU0b can be connected to neighboring sensing nodes in the same column. Similarly, the pass control signal SO_PASS<1> is provided to the gates of the pass transistors PT1a_U, PT1a_D, PT1b_U, and PT1b_D of the page buffer units PBU1a and PBU1b. A pass control signal SO_PASS<2> is provided to gates of the pass transistors PT2a_U, PT2a_D, PT2b_U, and PT2b_D of the page buffer units PBU2a and PBU2b.

A pass control signal SO_PASS<3> is provided to gates of the upper pass transistors PT3a_U and PT3b_U of the page buffer units PBU3a and PBU3b. On the other hand, the common pass control signal SOC_PASS<0> is provided to the gates of the lower pass transistors PT3a_D and PT3b_D of the page buffer units PBU3a and PBU3b.

If the pass control signals SO_PASS<0> to SO_PASS<3> are activated, the pass transistors PT0a_U, PT0a_D, PT1a_U, PT1a_D, PT2a_U, PT2a_D, PT3a_U, PT0b_U, PT0b_D, PT2b_D, PT1b_U, PT1b_U, PT3b_U are turned on. Then, the sensing nodes SO0a, SO1a, SO2a, and SO3a of the page buffer units PBU0a, PBU1a, PBU2a, and PBU3a of the same column are electrically connected. A combined sensing node C_SOa is formed according to the connection of the sensing nodes SO0a, SO1a, SO2a, and SO3a. And when the pass control signals SO_PASS<0> to SO_PASS<3> are activated, the sensing nodes SO0b, SO1b, SO2b, SO3b of the page buffer units PBU0b, PBU1b, PBU2b, and PBU3b arranged in the same column is also electrically connected. Accordingly, the combined sensing node C_SOb is also formed.

When the pass control signals SO_PASS<0> to SO_PASS<3> are deactivated, the sensing nodes SO0a, SO1a, SO2a, SO3a and the sensing nodes SO0b, SO1b, SO2b, SO3b are electrically disconnected from each other. Accordingly, the combined sensing node C_SOa is divided into sensing nodes SO0a, SO1a, SO2a, SO3a, respectively, of the page buffer units PBU0a, PBU0a, PBU2a, and PBU3a, and the combined sensing node C_SOb is also divided into sensing nodes SO0b, SO1b, SO2b, and SO3b of the page buffer units PBU0b, PBU1b, PBU2b, and PBU3b.

In addition, when the pass control signals SO_PASS<0> to SO_PASS<3> and the common pass control signal SOC_PASS<0> are activated, the lower pass transistors PT3a_D and PT3b_D of the page buffer units PBU3a and PBU3b are turned on. In addition, the combined sensing nodes C_SOa and C_SOb are electrically connected to the common sensing nodes SOCa and SOCb, respectively. On the other hand, when the common pass control signal SOC_PASS<0> is deactivated, the lower pass transistors PT3a_D and PT3b_D of the page buffer units PBU3a and PBU3b are turned off, and the combined sensing nodes C_SOa and C_SOb are electrically isolated from the common sensing nodes SOCa and SOCb, respectively.

Each of the page buffer units PBU0a to PBU3a may further include precharge transistors PM0a to PM3a. In the page buffer unit PBU0a, the precharge transistor PM0a may be connected between the first sensing node SO0a and a voltage terminal to which the precharge voltage is applied and may have a gate to which the load signal LOAD is applied. The precharge transistor PM0a may precharge the first sensing node SO0a with a precharge voltage in response to the load signal LOAD.

The first cache unit CU0a may include a monitor transistor NM7a_0, for example, the monitor transistor NM7a_0 may correspond to the transistor NM7 of FIG. 5. A source S of the monitor transistor NM7a_0 may be connected to the first common sensing node SOCa, and a cache monitoring signal MON_C<0> may be applied to a gate of the monitor transistor NM7a_0. The monitor transistors NM7a_0 to NM7a_3 included in each of the first to fourth cache units CU0a to CU3a may be commonly connected in parallel to the first common sensing node SOCa. For example, the source of each of the monitor transistors NM7a_0 to NM7a_3 may be commonly connected to the first common sensing node SOCa.

Precharge circuits SOC_PREa and SOC_PREb may be included between the page buffer units PBU3a and PUB3b and the first cache units CU0a and CU0b of the upper page buffers 131. The precharge circuit SOC_PREa may include a precharge transistor PMa and a shielding transistor NMa for precharging the first common sensing node SOCa. The precharge transistor PMa may be driven by the common sensing node load signal SOC_LOAD. The shielding transistor NMa may be driven by the common sensing node shielding signal SOC_SHLD. Similarly, the precharge circuit SOC_PREb may include a precharge transistor PMb and a shielding transistor NMb for precharging the second common sensing node SOCb. The precharge transistor PMb may be driven by the common sensing node load signal SOC_LOAD. The shielding transistor NMb may be driven by the common sensing node shielding signal SOC_SHLD.

The page buffer decoder 132 may be disposed adjacent to the upper page buffers 131 in the first horizontal direction HD1, and the page buffer decoders PBDECa and PBDECb may be disposed along the second horizontal direction HD2. The page buffer decoders PBDECa and PBDECb may be respectively connected to the first and second page buffer columns PGBUFa and PGBUFb. For example, the first page buffer decoder PBDECa may generate a decoder output signal according to a sensing result stored in the sensing latch SL of the first page buffer unit PBU0$a$ included in the first page buffer column PGBUFa.

The first page buffer decoder PBDECa may include an inverter INVa and series-connected transistors NOa, NOa', and NOa", and the second page buffer decoder PBDECb includes an inverter INVb and series-connected transistors NOb, NOb', and NOb". The inverter INVa receives the first page buffer signal PBSa from the first page buffer column PGBUFa, and the reference current signal REF_CUR is applied to the gate of the transistor NOa". The inverter INVb receives the second page buffer signal PBSb from the second page buffer column PGBUFb, and the reference current signal REF_CUR is applied to the gate of the transistor NOb".

For example, the first and second page buffer decoders PBDECa and PBDECb may receive the first and second page buffer signals PBSa and PBSb from the page buffer units PBU0$a$ and PBU0$b$, respectively. For example, when logic '0' is stored in the sensing latch SL of the page buffer unit PBU0$a$, the voltage levels of the first sensing node SO0$a$ and the first common sensing node SOCa may be referred to as logic low, and the first page buffer signal PBSa may correspond to a logic low voltage level of the first sensing node SO0$a$. In this case, the inverter INVa outputs a logic high signal, and accordingly, the transistor NOa is turned on, and the first page buffer decoder PBDECa may operate as a current sink.

The transistor NOa" may output a first signal (e.g., a reference current) to the wired OR terminal WOR_OUT based on the reference current signal REF_CURR. Here, the reference current is the current flowing in the transistor NOa" when transistor NOa" is turned on according to the reference current signal REF_CURR. Similarly, the transistor NOb" may output a second signal, that is, a reference current, to the wired OR terminal WOR_OUT based on the reference current signal REF_CURR. The wired OR terminal WOR_OUT may be commonly connected to the first and second page buffer decoders PBDECa and PBDECb, and accordingly, the first signal and the second signal outputted from the first and second page buffer decoders PBDECa and PBDECb may be accumulated in the wired OR terminal WOR_OUT to be generated as an output signal. For example, the output signal may correspond to a current signal flowing through the wired OR terminal WOR_OUT.

Figure 8:
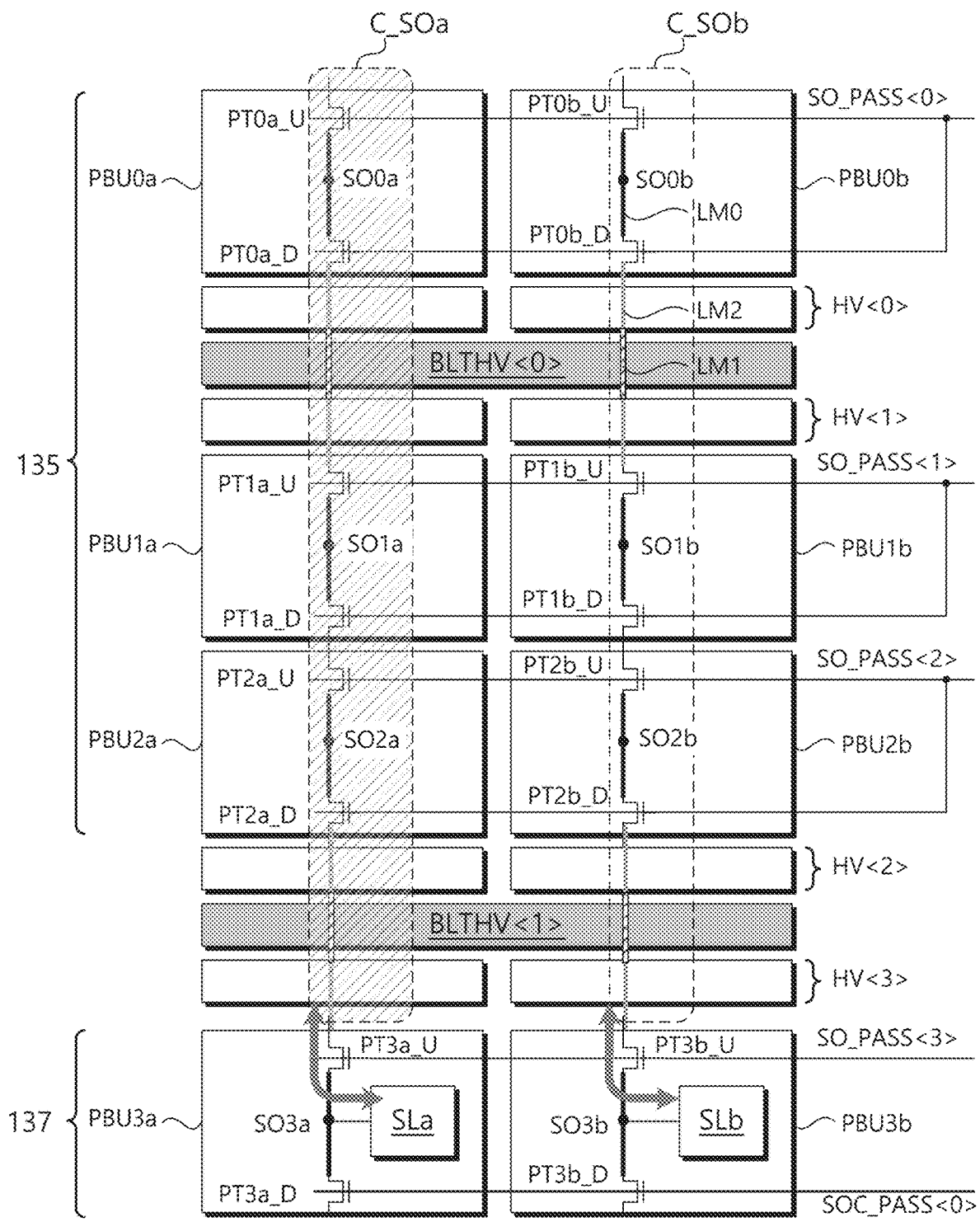
FIG. 8 is a diagram schematically illustrating a page buffer unit performing on-chip valley search OVS among upper page buffers of FIG. 7 and sensing nodes of the remaining page buffer units.

FIG. 8 is a diagram schematically illustrating sensing nodes of a page buffer unit performing on-chip valley search OVS sensing and nodes of the remaining page buffer units among upper page buffers of FIG. 7.

Referring to FIG. 8, while the page buffer units 137 perform an on-chip valley search OVS, the combined sensing nodes C_SOa and C_SOb of the unselected page buffer units 135 can be used to store data of sensing latches SLa, SLb. Here, a plurality of page buffer units included in each of the first page buffer column PGBUFa and the second page buffer column PGBUFb are illustrated. For convenience of description, features of the present invention will be described through the configuration and functions of the page buffer units PBU0$a$ to PBU3$a$ included in the first page buffer column PGBUFa forming the combined sensing node C_SOa. Of course, it will be well understood that this description may equally be applied to the page buffer units PBU0$b$ to PBU3$b$ included in the second page buffer column PGBUFb forming the combined sensing node C_SOb.

Further, for convenience of description, features of the present invention will be described based on the page buffer unit PBU3$a$ performing an on-chip valley search OVS on the memory cell through the bit line BL; and then, the remaining three unselected page buffer units PBU0$a$, PBU0$a$, and PBU2$a$ do not perform a separate sensing operation or a write operation. Accordingly, the sensing nodes SO0$a$, SO1$a$, and SO2$a$ of each of the remaining three unselected page buffer units PBU0$a$, PBU1$a$, and PBU2$a$ may constitute the combined sensing node C_SOa. In addition, the combined sensing node C_SOa may serve as a storage for performing a full on-chip valley search (Full OVS) for a plurality of program states in the sensing latch SLa of the page buffer unit PBU3$a$.

For example, the page buffer unit PBU3$a$ may perform an on-chip valley search OVS read on LSB page data for a selected memory cell. A fine sensing operation for the corresponding memory cells may be performed with reference to the result of the on-chip valley search OVS for the first program state performed previously. In addition, data in the sensing latch SLa stored as a result of the fine sensing may be dumped to the combined sensing node C_SOa for the on-chip valley search OVS for a second program state. To this end, the pass transistor PT3$a$_U of the page buffer unit PBU3$a$ is turned on, and data stored in the sensing latch SLa may be transferred to the combined sensing node C_SOa. At this time, to constitute the combined sensing node C_SOa, the pass control signals SO_PASS<3:0> are activated, and the pass transistors PTOa_U, PTOa_D, PT1$a$_U, PT1$a$_D, PT2$a$_U, PT2$a$_D, and PT3$a$_U are turned on. In addition, the common pass control signal SOC_PASS<0> is deactivated, and the pass transistor PT3$a$_D maintains a blocked state. After the data is moved to the combined sensing node C_SOa, the pass control signals SO_PASS<3:0> are deactivated, and then the pass transistors PTOa_U, PTOa_D, PT1$a$_U, PT1$a$_D, PT2$a$_U, PT2$a$_D, and PT3$a$_U are turned off.

Thereafter, when the full on-chip valley search OVS of the page buffer unit PBU3$a$ is terminated, the data temporarily stored in the combined sensing node C_SOa may be returned back to the sensing latch SLa of the page buffer unit PBU3$a$. Data exchange between the sensing latch SLa and the combined sensing node C_SOa will be described in more detail through a timing diagram to be described later.

A structure for configuring the combined sensing nodes C_SOa and C_SOb in the page buffer units 135 and 137 is as follows. To configure the combined sensing node C_SOa, the sensing node SO0$a$ between the pass transistors PTOa_U and PTOa_D may be formed using the first metal layer LM0. Similarly, the sensing node SO1$a$ between the pass transistors PT1$a$_U and PT1$a$_D, the sensing node SO2$a$ between the pass transistors PT2$a$_U and PT2$a$_D, and the sensing node SO3$a$ between the pass transistors PT3$a$_U and PT3$a$_D may be formed by utilizing the first metal layer LM0. In addition, wirings of the high voltage regions HV<0>, HV<1>, HV<2>, and HV<3> may be formed using the third metal layer LM2. In addition, the bit line through via BLTHV disposed between the high voltage regions HV<0> and HV<1> may be formed using the second metal layer LM1 and the vias to provide an electrical connection between the sensing nodes SO0a, SO1a, SO2a, and SO3a. As a result, the combined sensing node C_SOa includes a plurality of metal layers LM0, ML1, and LM2, and provides a capacitance capable of exchanging data with the sensing latch SLa of the page buffer unit PBU3a.

Figure 9:
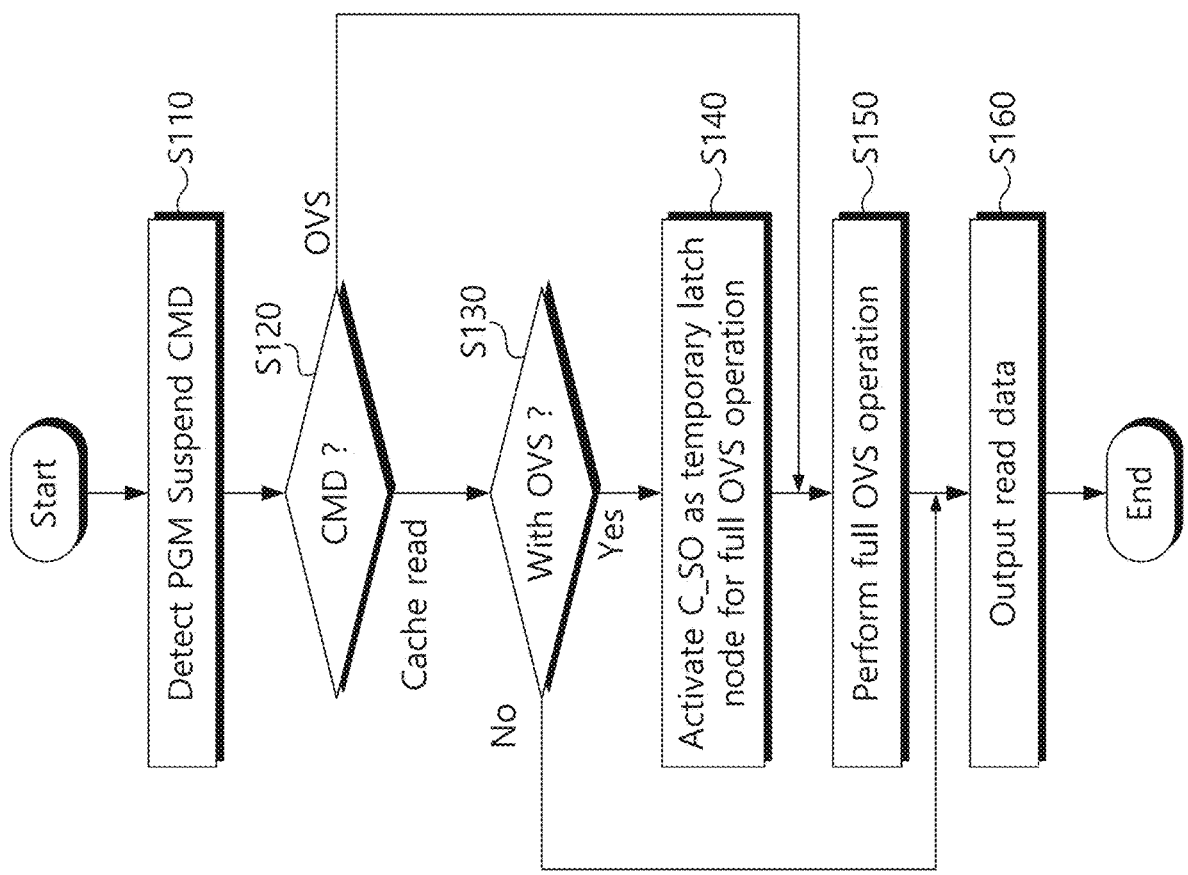
FIG. 9 is a flowchart illustrating an operation method utilizing the combined sensing node C_SO performed in the control circuit of FIG. 1.

FIG. 9 is a flowchart illustrating an operation method utilizing the combined sensing node C_SO performed in the control circuit of FIG. 1. Referring to FIGS. 1 and 9, the nonvolatile memory device 100 may perform a cache read operation in a program suspend period with a full on-chip valley search (Full OVS) mode.

In step S110, the control circuit 140 detects a program (PGM) suspend command (CMD) PGM Suspend CMD. The program suspend command PGM Suspend CMD is a command for suspending a program operation for a specific memory block and performing access, such as a cache read, to another memory block.

In step S120, the control circuit 140 determines whether the command CMD provided after the program suspend command PGM Suspend CMD is a cache read command or an on-chip valley search OVS command. If the command CMD provided after the program suspend command PGM Suspend CMD corresponds to cache read, the procedure moves to step S130. On the other hand, when the command CMD provided after the program suspend command PGM Suspend CMD is a normal on-chip valley search OVS command, the procedure moves to step S150.

In step S130, the control circuit 140 determines whether a cache read operation is accompanied by an on-chip valley search OVS. If the cache read operation is accompanied by an on-chip valley search OVS, the procedure moves to step S140. On the other hand, when the cache read operation is a normal cache read operation not accompanied by on-chip valley search OVS, the procedure moves to step S160.

In step S140, the control circuit 140 activates the combined sensing node C_SO of the page buffer to perform an on-chip valley search OVS during a cache read operation. For example, the control circuit 140 controls the page buffer circuit 130 to temporarily store the data stored in the sensing latch SL in the combined sensing node C_SO instead of the cache latch CL occupied by the cache read data. Activation of the combined sensing node C_SO eventually occurs in the cache read mode accompanied by the on-chip valley search OVS that occurs in the program suspend period.

In step S150, the control circuit 140 may perform a full on-chip valley search OVS, even during a cache read operation, using the combined sensing node C_SO of the page buffer. For example, a fine sensing operation is performed based on a result of an on-chip valley search OVS performed on the first program state. The fine sensing data obtained according to the result of the fine sensing operation is stored in the sensing latch SL. Then, the control circuit 140 will move the fine sensing data from the sensing latch SL to the combined sensing node C_SO. And then, an on-chip valley search OVS for the second program state may be performed using the empty sensing latch SL according to the movement of the fine sensing data. When the on-chip valley search OVS for the second program state is completed, the control circuit 140 may return the data stored in the combined sensing node C_SO back to the sensing latch SL.

In step S160, the control circuit 140 may combine the data returned from the coupling sensing node C_SO to the sensing latch SL and the fine sensing data in which the on-chip valley search OVS for the second program state is reflected. Thereafter, when data stored in the cache latch CL is output, the combined data may be transferred to the cache latch CL.

In the above, an example of an operation using the combined sensing node C_SO performed in the control circuit 140 has been briefly described. However, it will be well understood that the operation mode utilizing the combined sensing node C_SO may be used in various cases in which the utilization of the cache latch CL is limited.

Figure 10:
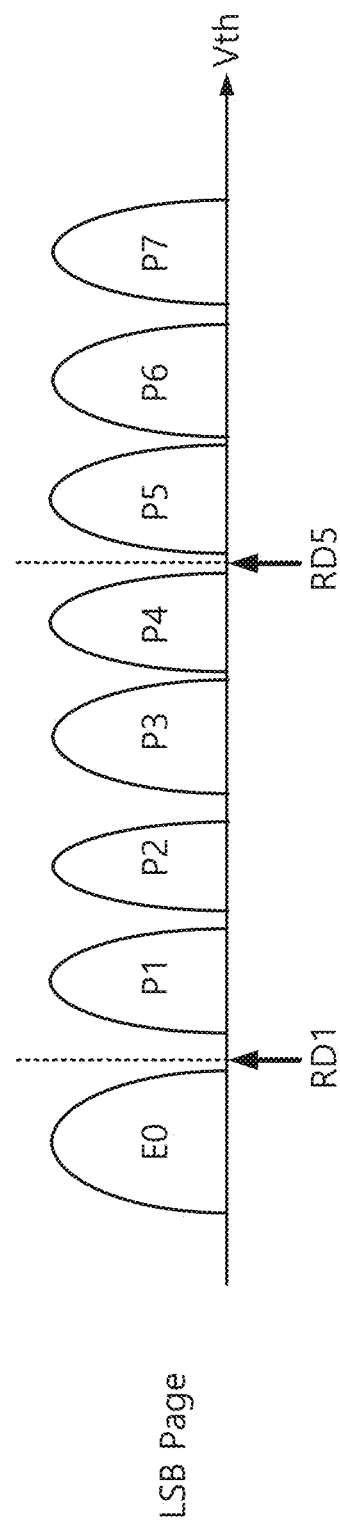
FIG. 10 is a diagram illustrating a reading method for a specific page of a memory cell according to at least one embodiment of the present invention.

FIG. 10 is a diagram illustrating a reading method for a specific page of a memory cell according to an embodiment of the present invention. Referring to FIG. 10, a method of reading the least significant bit (LSB) page of a triple level cell (hereinafter, TLC) capable of storing 3-bit data per cell is illustrated. Also, for convenience of description, features of the present invention will be described based on the nonvolatile memory device 100 reading the cache accompanied by the on-chip valley search OVS in the program suspend period.

In order to read the least significant bit LSB page of the selected memory cell, a read voltage RD5 may be applied to the word line of the selected memory cell. Then, an on-chip valley search OVS read of the read voltage RD5 is performed. The on-chip valley search OVS may be performed by only one or some of the page buffers. Data latched according to the result of the on-chip valley search OVS is transferred to the wired OR terminal WOR_OUT and used for a bit count operation. Fine sensing is performed according to the read voltage RD5 of the level adjusted according to the results of the on-chip valley search OVS and the bit count. The fine sensing result is stored in the sensing latch SL of the page buffer units PBU. Data sensed according to the adjusted read voltage RD5 will be referred to as first data.

Subsequently, the combined sensing node C_SO of the unused page buffer units among the page buffer units PBU is activated by the control circuit 140. For example, the control circuit 140 moves the first data of the sensing latch SL sensed by fine sensing to the combined sensing node C_SO instead of the cache latch CL occupied by the cache read data. In addition, the on-chip valley search OVS using the read voltage RD1 and a bit count may be performed using the empty sensing latch SL according to data movement. Thereafter, the first data stored in the combined sensing node C_SO may be returned to the sensing latch SL again. The first data returned to the sensing latch SL and the second data sensed according to the adjusted read voltage RD1 are decoded and stored in the sensing latch SL.

In the above, a cache read operation accompanied by an on-chip valley search OVS of the LSB page of a triple-level cell TLC has been described. However, the operation of performing a full on-chip valley search OVS using this combined sensing node C_SO as temporary storage can be equally applied to central significant bit CSB pages or most significant bit MSB pages.

Figure 11:
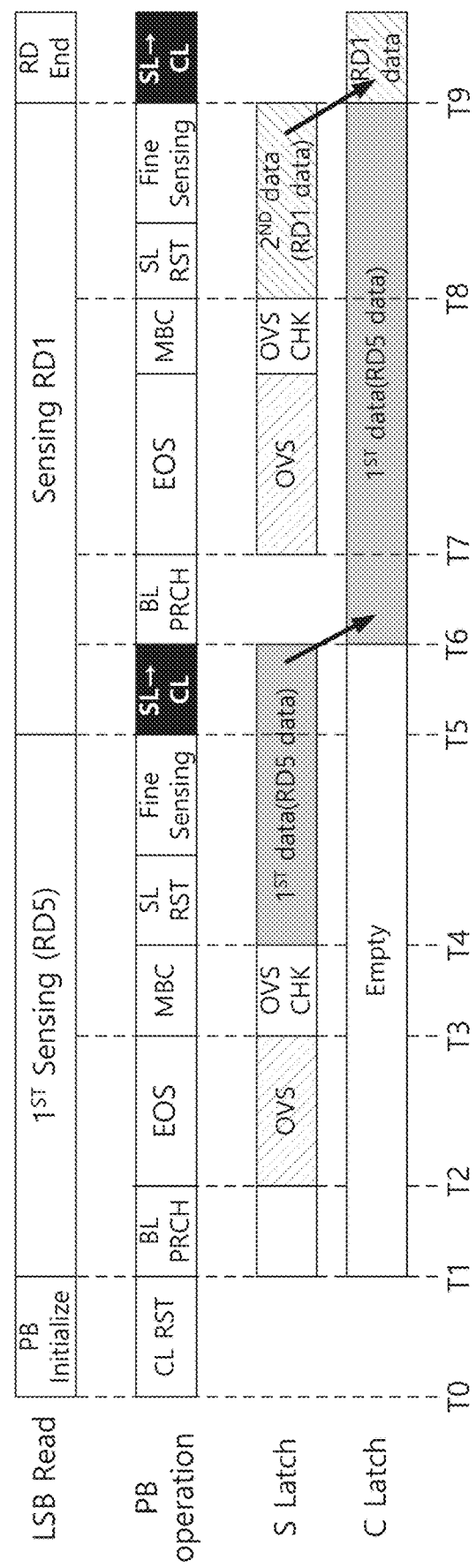
FIG. 11 is a timing diagram illustrating a read operation accompanied by an on-chip valley search OVS in a program suspend period.

FIG. 11 is a timing diagram illustrating a read operation accompanied by an on-chip valley search OVS during a program suspend period. Referring to FIG. 11, when the cache latch CL is empty, a full on-chip valley search Full OVS can be performed using the cache latch CL.

At time T0, the page buffer for on-chip valley search OVS is initialized. That is, the cache latch CL of the page buffer is reset.

At time T1, a first sensing 1st Sensing operation is started. For example, a read voltage RD5 is applied to the word line of the memory cell for sensing, and precharge is performed on the bit line BL. A setting for the sensing latch SL will also be made.

At time T2, the page buffer unit performs an on-chip valley search OVS on the read voltage RD5. For on-chip valley search OVS, read voltages of different levels may be provided to word lines of selected memory cells. Alternatively, data of the memory cell may be sensed at different development times of bit lines by the sensing latch SL of the page buffer unit with respect to the read voltage RD5 of the same level.

At time T3, an on-chip valley search OVS check utilizing the mass bit count is performed using the result of the on-chip valley search OVS read. For example, a voltage corresponding to a valley trough may be determined by comparing data at different read voltage RD5 levels, or a development time with the smallest error may be determined with respect to the read voltage RD5 of the same level.

At time T4, a data read that applies the results of the on-chip valley search OVS is performed. First, the sensing latch SL is reset, and fine sensing is performed according to the read voltage RD5 adjusted according to the on-chip valley search OVS result or the adjusted development time. As a result of fine sensing, first data (RD5 data) is stored in the sensing latch SL.

At time T5, the first data stored in the sensing latch SL moves to the cache latch CL. To this end, the sensing node SO is precharged, and at a time T6, data corresponding to the first data stored in the sensing latch SL is moved to the cache latch CL via the sensing node SO.

At a time T7, an on-chip valley search OVS is performed on the read voltage RD1 using the sensing latch SL of the page buffer unit. Different levels of read voltage RD1 may be provided for on-chip valley search OVS. Alternatively, data of the memory cell may be sensed according to different bit line development times under the condition of the read voltage RD1 of the same level. Then, an on-chip valley search OVS check is performed using the result of the on-chip valley search OVS read.

At time T8, a data read that applies the results of the on-chip valley search OVS read is performed. For example, first, the sensing latch SL is reset, and fine sensing is performed according to the read voltage RD1 adjusted according to the on-chip valley search OVS result and/or the adjusted development time. As a result of the fine sensing, second data (RD1 data) is stored in the sensing latch SL.

At a time T9, the second data latched in the sensing latch SL may be transferred to the cache latch CL for output.

According to the above timing diagram, since the cache latch CL is empty during a normal read operation, it is possible to move the data of the sensing latch SL to the cache latch CL. Accordingly, it is possible to perform a full on-chip valley search OVS even during read target states using the sensing latch SL.

Figure 12:
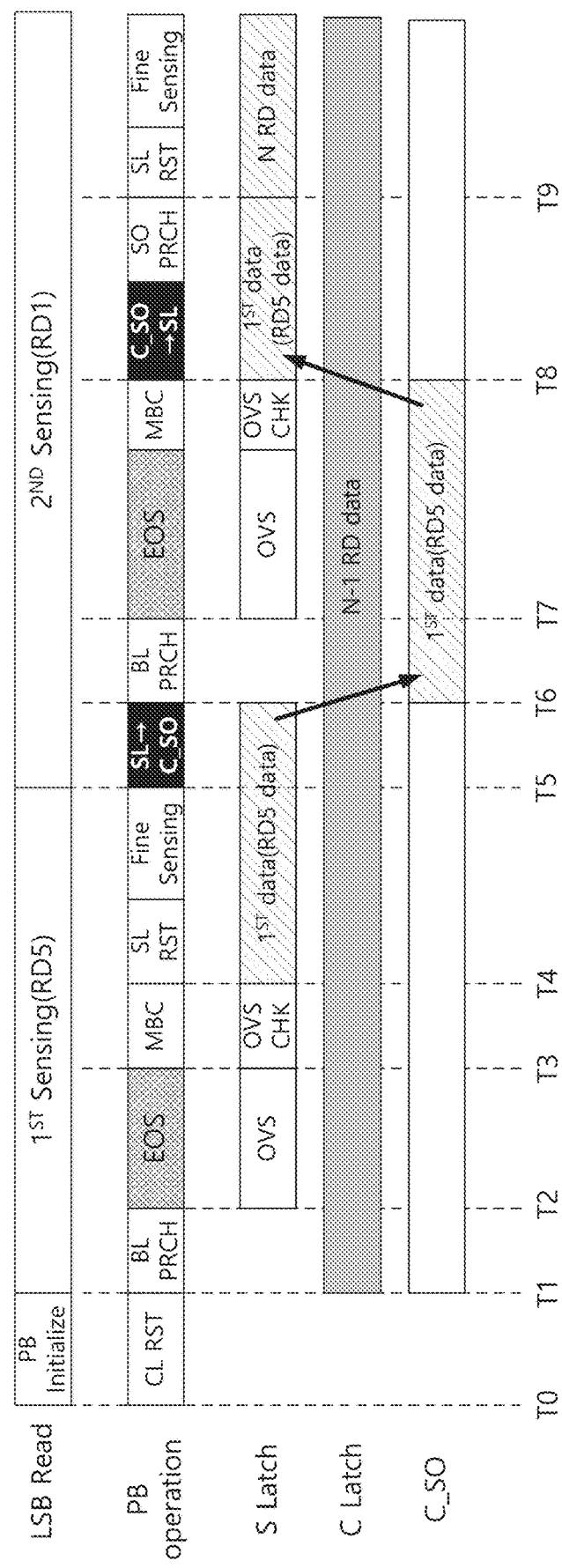
FIG. 12 is a timing diagram illustrating a cache read operation accompanied by an on-chip valley search OVS in a program suspend period.

FIG. 12 is a timing diagram illustrating a cache read operation accompanied by an on-chip valley search OVS during the program suspend period. Referring to FIG. 12, when the cache latch CL is occupied by the cache read data, it is possible to perform a full on-chip valley search (Full OVS) by using the combined sensing node C_SO of the present invention. In the cache latch CL, data sensed by a previous cache read command is waiting for output.

At time T0, the page buffer for on-chip valley search OVS is initialized.

At time T1, a first sensing operation is started. For example, a read voltage RD5 is applied to the word line of the memory cell for sensing, and precharge is performed on the bit line BL. And the setting for the sensing latch SL will be made.

At time T2, the page buffer unit performs the on-chip valley search OVS on the read voltage RD5. Different levels of the read voltage RD5 may be provided for the on-chip valley search OVS. Alternatively, data of the memory cell may be sensed according to different development times of bit line in the sensing latch SL of the page buffer unit with respect to the read voltage RD5 of the same level.

At time T3, an on-chip valley search OVS check utilizing a mass bit count (MBC) is performed using the result of an on-chip valley search OVS read. For example, a voltage corresponding to a valley can be determined by comparing data at different read voltage levels for an on-chip valley search OVS check. Alternatively, an on-chip valley search OVS check may be performed in a manner of determining a development time with the smallest error under the condition of the read voltage RD5 of the same level.

At time T4, a data read, that applies the results of the on-chip valley search OVS read, is performed. For example, first the sensing latch SL is reset, and fine sensing is performed according to the adjusted read voltage RD5 and/or the adjusted development time according to the on-chip valley search OVS result. As a result of fine sensing, first data is stored in the sensing latch SL.

At time T5, a second sensing operation is started. For example, a read voltage RD1 is applied to the word line of the memory cell for sensing, and precharge is performed on the bit line BL. To this end, first data of the sensing latch SL is dumped to the combined sensing node C_SO. In at least one embodiment, to dump the first data to the combined sensing node C_SO, the sensing node SO is precharged. And at time T6, the first data stored in the sensing latch SL moves to the combined sensing node C_SO via the sensing node SO.

At a time T7, an on-chip valley search OVS corresponding to the read voltage RD1, using the sensing latch SL of the page buffer unit, is performed. Different levels of read voltages RD1 may be provided for on-chip valley search OVS, and/or data of the memory cell may be sensed according to different bit line development times under the condition of the read voltage RD1 of the same level. Then, an on-chip valley search OVS check is performed using the result of the on-chip valley search OVS.

At time T8, the first data (1st data) moved to the combined sensing node C_SO is returned to the sensing latch SL. To this end, the sensing node SO is precharged, and the level corresponding to the first data maintained in the combined sensing node C_SO moves to the sensing latch SL via the sensing node SO.

At time T9, a data read that applies the results of the on-chip valley search OVS read is performed. For example, first the sensing latch SL is reset, and the fine sensing is performed according to the read voltage RD1 adjusted according to the on-chip valley search OVS read result and/or the adjusted development time. The result of the fine sensing and the first data are decoded, and the cache read data (N RD data) is stored in the sensing latch SL. The cache read data (N RD data) is data to be output after the cache read data N−1 RD data of the current cache latch CL is output.

According to the above-described timing diagram, in the program suspend period of the nonvolatile memory device 100, the cache latch is occupied with data to be output during a cache read operation. Therefore, an additional latch is required for on-chip valley search OVS for multiple states.

However, according to an embodiment of the present invention, a full on-chip valley search (Full OVS) may be performed using the combined sensing node C_SO without an additional latch configuration.

Figure 13:
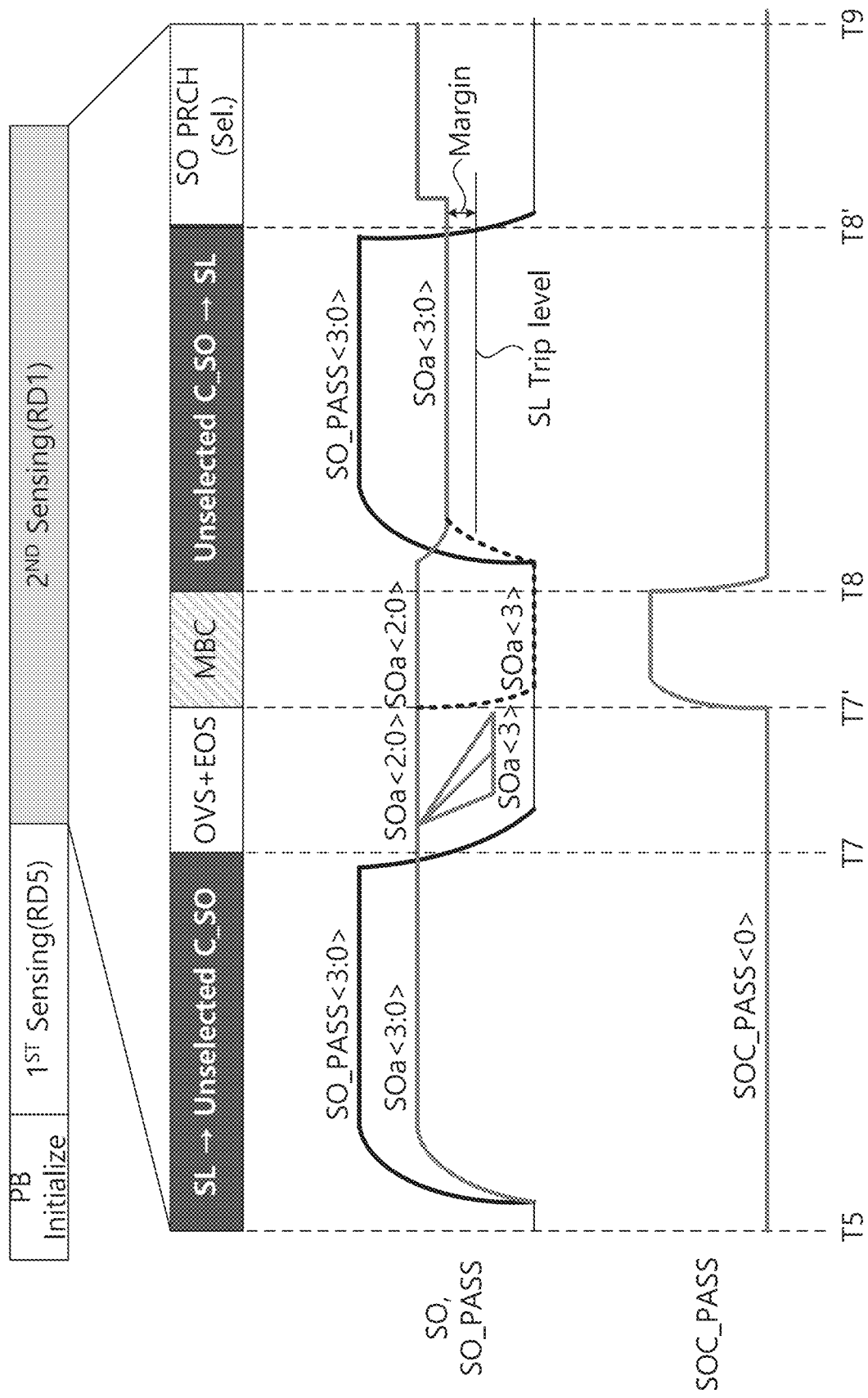
FIG. 13 is a waveform diagram illustrating a method of configuring the combined sensing node C_SO in the second sensing section of FIG. 12.

FIG. 13 is a waveform diagram illustrating a method of configuring the combined sensing node C_SO in the second sensing period of FIG. 12. Referring to FIG. 8, FIG. 12, and FIG. 13, the first data stored in the sensing latch SL for the second sensing may be stored using the capacity provided by the combined sensing node C_SO and can be restored later. For convenience of description, operations of the page buffer units PBU0a, PBU1a, PBU2a, and PBU3a belonging to the first page buffer column PGBUFa will be mainly described. However, the described operations may be equally applied to the page buffer units PBU0b, PBU1b, PBU2b, and PBU3b belonging to the second page buffer column PGBUFb.

At a time T5, a dump of the first data stored in the sensing latch SL to the combined sensing node C_SO starts. To this end, the control circuit 140 (refer to FIG. 1) transitions the pass control signals SO_PASS<3:0> to a high level. For example, in order to increase the charging capacity of the combined sensing node C_SO, the pass control signals SO_PASS<3:0> may be provided in an amount equal to or greater than the sum (e.g., 3V) of the internal power supply voltage (e.g., 2V) and the threshold voltage (e.g., 1V) of the pass transistors PT0a_U, PT0a_D, PT1a_U, PT1a_D, PT2a_U, PT2a_D, and PT3a_U. Then, the sensing nodes SOa<3:0> of each of the page buffer units PBU0a, PUB1a, PBU2a, and PBU3a have a shut-off voltage level corresponding to the size of the pass control signals SO_PASS<3:0> (e.g., for example, it will rise to 2V). At this time, the first data stored in the sensing latch SLa is dumped to the combined sensing node C_SO to which the sensing nodes SOa<3:0> are coupled. This process will be described with reference to a waveform diagram to be described later. When dumping of the first data to the combined sensing node C_SO is completed, the pass control signals SO_PASS<3:0> are deactivated. That is, the pass control signals SO_PASS<3:0> will fall to the ground level.

At time T7, an on-chip valley search OVS is performed. To this end, the sensing node SOa<3> of the page buffer unit PBU3a transmits the develop result transmitted from the bit line BL to the sensing latch SLa. The sensing latch SLa transfers latched data at different development times as a value for a bit count through the first page buffer decoder PBDECa.

At time T7', the result of the on-chip valley search OVS read stored in the sensing latch SLa is transferred to the page buffer decoder PBDECa for counting. The common pass control signal SOC_PASS<0> is activated to a high level in order to transfer the result of the on-chip valley search OVS read stored in the sensing latch SLa to the page buffer decoder PBDECa. The pass transistor PT3a_D of the page buffer unit PBU3a is turned on by the common pass control signal SOC_PASS<0>, and the on-chip valley search OVS read result stored in the sensing latch SLa is transmitted to the page buffer decoder PBDECa via the sensing node SO3a.

At a time T8, the common pass control signal SOC_PASS<0> transitions to the low level again, and the pass transistor PT3a_D of the page buffer unit PBU3a is turned off again. And the first data stored in the combined sensing node C_SO is returned to the sensing latch SLa again. To this end, the control circuit 140 transitions the pass control signals SO_PASS<3:0> to a high level. Then, data of the sensing latch SLa of the page buffer units PBU3a may be set according to the voltage of the combined sensing node C_SO. When the first data stored in the combined sensing node C_SO is at a high level, the voltage level shown may be set. In at least one embodiment, the high level voltage of the combined sensing node C_SO has a higher value than the trip level SL Trip level of the sensing latch SLa.

At time T8', when data dumping from the combined sensing node C_SO to the sensing latch SLa of the page buffer unit PBU3a is completed, the pass control signals SO_PASS<3:0> transition to a low level. Then, the sensing nodes SOa<3:0> will then be precharged for fine sensing using the results of the on-chip valley search OVS.

FIG. 14A and FIG. 14B are waveform diagrams illustrating a data movement process of the page buffer unit PBU3a according to an embodiment of the present invention. FIG. 14A shows control signals for data dumping from the sensing latch SLa to the combined sensing node C_SO. FIG. 14B shows waveforms of control signals for data restoration from the combined sensing node C_SO to the sensing latch SLa. Referring to FIGS. 5, 8, and 14A, data movement from the sensing latch SLa to the combined sensing node C_SO may be performed in a manner that discharges or maintains a precharged voltage according to the data of the sensing latch SLa.

At time t0, when the load signal LOAD is activated to the low level L, the precharge transistors PM0a, PM1a, PM2a, and PM3a are turned on. Then, each of the sensing nodes SO0a, SO1a, SO2a, and SO3a of the page buffer units PBU0a, PBU1a, and PBU2a of the same page buffer column will be charged with the precharge voltage.

At time t1, the pass control signals SO_PASS<3:0> are activated to a high level. Then, the sensing nodes SO0a, SO1a, SO2a, and SO3a of the page buffer units PBU0a, PBU1a, and PBU2a of the same page buffer column including the page buffer unit PBU3a are connected. A combined sensing node C_SO is constituted according to the connection of the sensing nodes SO0a, SO1a, SO2a, and SO3a.

At time t2, when the load signal LOAD is deactivated to the high level H, the precharge transistors PM0a, PM1a, PM2a, and PM3a are turned off.

At time t3, the ground control signal SOGND<3> transitions to a high level. Then, the charge precharged in the combined sensing node C_SO may be discharged or maintained according to a logic value of the first data stored in the sensing latch SLa.

At time t4, the ground control signal SOGND<3> transitions to the low level. Then, the data dump of the combined sensing node C_SO and the sensing latch SLa is terminated.

At a time t5, the pass control signals SO_PASS<3:0> transition to a low level. Then, the sensing nodes SO0a, SO1a, SO2a, and SO3a of the page buffer units PBU0a, PBU1a, and PBU2a constituting the combined sensing node C_SO are electrically isolated. However, the logic values precharged in each of the sensing nodes SO0a, SO1a, SO2a, and SO3a may be maintained.

Referring to FIGS. 5, 8, and 14B, data movement from the combined sensing node C_SO to the sensing latch SLa of the page buffer unit PBU3a may be performed in a charge-sharing manner. Here, the load signal LOAD may maintain an inactive state at a high level H.

At time t1', the pass control signals SO_PASS<3:0> are activated to a high level. Then, the sensing nodes SO0a, SO1a, SO2a, and SO3a of the page buffer units PBU0a, PBU1a, and PBU2a, PBU3a of the same page buffer column are electrically connected. And then, charges corresponding to the first data temporarily stored in the sensing nodes SO0a, SO1a, and SO2a are distributed to the sensing nodes SO0a, SO1a, SO2a, and SO3a. If the level of the first data temporarily stored in the sensing nodes SO0a, SO1a, and SO2a is a logic low, the voltages of the sensing nodes SO0a, SO1a, SO2a, and SO3a will keep ground level even after they are connected.

In the previous step, the sensing node SO3a was used to transmit the on-chip valley search OVS read result of the page buffer unit PBU3a to the page buffer decoder PBDECa. Accordingly, charged charges may not exist in the sensing node SO3a. When the level of the first data is logic high (e.g., when the pass control signals SO_PASS<3:0> are activated to a high level) the voltages of the nodes SO0a, SO1a, SO2a, and SO3a constituting the combined sensing node C_SOa may decrease slightly by charge sharing. An example of this is shown in FIG. 13.

At time t2', the ground control signal SOGND<3> for connecting the sensing latch SLa of the page buffer unit PBU3a and the sensing node SO3a transitions to a high level. Then, the charges charged in the sensing nodes SO0a, SO1a, SO2a, and SO3a constituting the combined sensing node C_SOa may be transferred to the sensing latch SLa.

At time t3', after the data stored in the combined sensing node C_SOa moves to the sensing latch SLa, the ground control signal SOGND<3> transitions to a low level. Then, the first data moved to the sensing latch SLa is fixed to the sensing latch SLa of the page buffer unit PBU3a. At time t4', when the pass control signals SO_PASS<3:0> transition to the low level again, data movement between the combined sensing node C_SOa and the sensing latch SLa is terminated.

In the above, the data movement process from the combined sensing node C_SOa to the sensing latch SLa has been briefly described.

Figure 15:
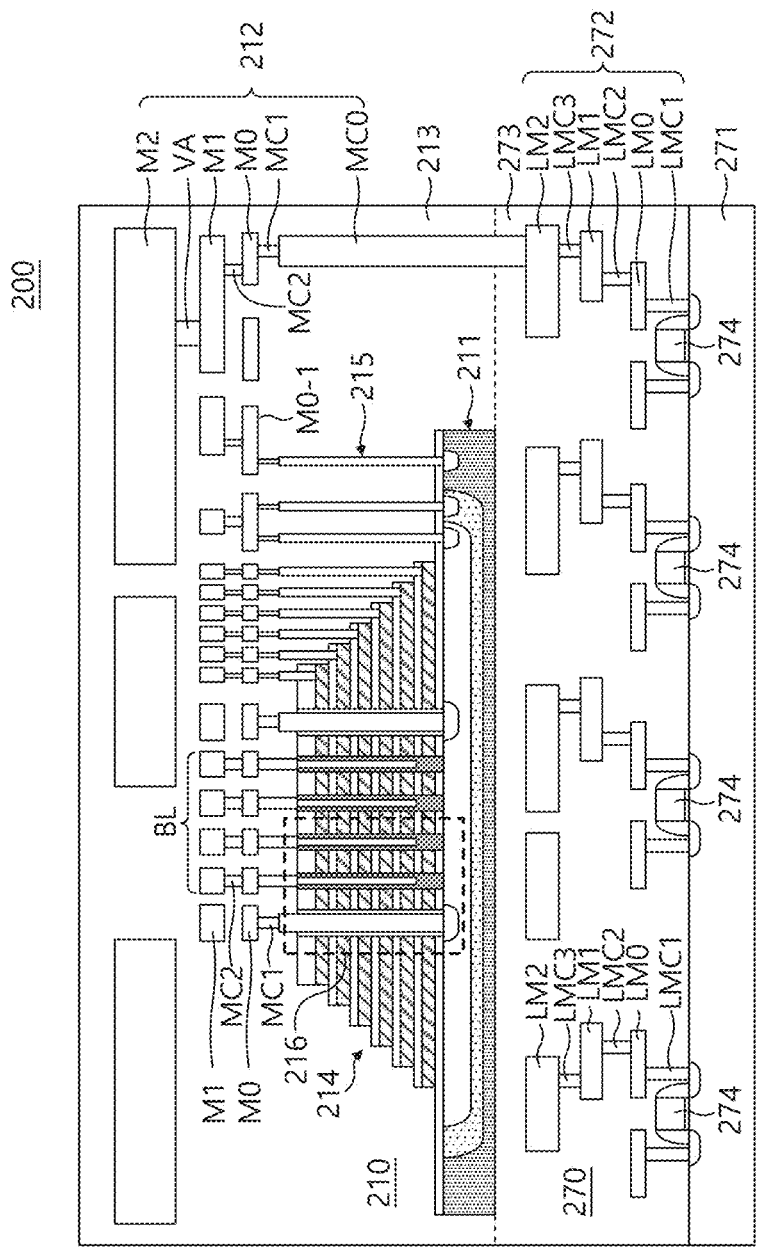
FIG. 15 is a cross-sectional view schematically illustrating a COP structure of a nonvolatile memory device according to at least one embodiment of the present invention.

FIG. 15 is a cross-sectional view schematically illustrating a COP structure of a nonvolatile memory device according to an embodiment of the present invention. Referring to FIG. 15, the nonvolatile memory device 200 may have a cell on peripheral COP structure in which a cell region 210 is stacked on a peripheral region 270. At least a portion of the peripheral region 270 and at least a portion of the cell region 210 may vertically overlap. For convenience, an example in which all the cell region 210 and the entire peripheral region 270 overlap each other will be described herein, but the present invention is not intended to be limited thereto.

The peripheral region 270 includes one or more peripheral transistors 274 disposed on the lower substrate 271, a peripheral circuit wiring 272 electrically connected to the peripheral transistor 274, and the lower insulating layer 273 covering the peripheral circuit wiring 272 and the peripheral transistor 274.

The cell region 210 may include an upper substrate 211, a cell array 214 disposed on the upper substrate 211, and an upper insulating layer 213 covering the cell array 214. The cell region 210 may further include a connection circuit wiring 212 electrically connecting the cell array 214 and the peripheral circuit wiring 272. The cell array 214 may include a metal contact 215 electrically connecting the cell array 214 to the connection circuit wiring 212.

In the peripheral region 270, the lower substrate 271 may include a semiconductor substrate such as a silicon wafer. The peripheral circuit wiring 272 may include, for example, a lower metal line LM0, an intermediate metal line LM1, and an upper metal line LM2 sequentially stacked on the lower substrate 271. The peripheral circuit wiring 272 includes a lower metal contact LMC1 electrically connecting the peripheral transistor 274 to the lower metal wiring LM0, and a middle metal contact LMC2 electrically connecting lower metal wiring LM0 to middle metal wiring LM1, and upper metal contact LMC3 electrically connecting middle metal wiring LM1 to upper metal wiring LM2.

In the cell region 210, the cell array 214 may have a three-dimensional structure in which a plurality of cells is vertically stacked on an upper substrate 211 having a well structure. The metal contact 215 may electrically connect the plurality of cells of the cell array 214 and the upper substrate 211 to the connection circuit wiring 212.

The connection circuit wiring 212 may be electrically connected to the peripheral circuit wiring 272. The connection circuit wire 212 may include a lower metal wire M0, an intermediate metal wire M1, and an upper metal wire M2 sequentially stacked on the cell array 214. The connection circuit wiring 212 further includes a connection metal contact MC0 that electrically connects the peripheral circuit wiring 272 to the connection circuit wiring 212, a lower metal contact MC1 electrically connecting the connection metal contact MC0 and the lower metal wiring M0, the middle metal contact MC2 for electrically connecting the lower metal wire M0 to the middle metal wire M1, a via VA as an upper metal contact electrically connecting the middle metal wiring M1 to the upper metal wiring M2. The lower metal contact MC1 may connect the cell array 214 to the intermediate metal line M0. The middle metal wiring M1 may include a bit line BL electrically connected to a vertical channel of the cell array 214.

The nonvolatile memory device 200 having the above-described COP structure can perform a full on-chip valley search OVS even in a state in which the cache latch is occupied by controlling the combined sensing node without adding a latch of the page buffer circuit. Accordingly, it is possible to reduce data errors in a cache read operation performed in the program suspend period, thereby providing high reliability.

While the present disclosure has been described with reference to embodiments thereof, it will be apparent to those of ordinary skill in the art that various changes and modifications may be made thereto without departing from the spirit and scope of the present disclosure as set forth in the following claims.

What is claimed is:

1. A cache read method of a nonvolatile memory device including a memory cell array, a plurality of page buffer units, and cache latches, each of the plurality of page buffer units having a sensing latch and a sensing node line, the method comprising:
performing a first on-chip valley search (OVS) read on a selected memory cell using a first sensing node line and a first sensing latch of a first page buffer unit of the plurality of page buffer units;
storing, during a program suspend period, first data sensed from the selected memory cell in the first sensing latch, the first data based on a result of the first OVS read;
transferring the first data to sensing node lines of at least one page buffer unit, from a remainder of the plurality of page buffer units; and
performing a second OVS read on the selected memory cell using the first sensing latch,
wherein, during the program suspend period, the plurality of page buffer units are occupied by write data of a suspended program operation.

2. The method of claim 1, further comprising:
connecting the first sensing node line of the first page buffer unit to a sensing node line of each of the plurality of page buffers units according to a pass control signal; and transmitting a result of the second OVS read to a page buffer decoder in response to a common pass control signal, wherein the sensing node lines of the plurality of page buffer units are connected to each other by pass transistors, the pass transistors configured to be switched on or off according to the pass control signal.

3. The method of claim 2, wherein the transferring the first data includes:

turning on one of the pass transistors of at least one of the plurality of page buffer units to electrically connect the sensing node lines of the at least one page buffer unit and another of the plurality of page buffer units;

precharging the sensing node lines of the at least one page buffer unit; and setting, based on the first data, at least one of a read voltage or development time applied to the precharged sensing node lines.

4. The method of claim 2, wherein transferring the result of the second OVS read from the first sensing latch to the page buffer decoder includes deactivating the pass control signal and activating the common pass control signal.

5. The method of claim 1, further comprising:

returning the first data stored in the sensing node lines of the at least one page buffer unit to the first sensing latch after the second OVS read is completed.

6. The method of claim 5, further comprising:

sensing second data stored in the selected memory cell based on the result of the second OVS read.

7. The method of claim 1, wherein the cache read method of the nonvolatile memory device is performed in a program suspend period of the nonvolatile memory device.

8. A nonvolatile memory device comprising:

a cell array comprising a plurality of memory cells serially coupled to bit lines;

a page buffer circuit including a plurality of page buffer units configured to program or sense at least one of the plurality of memory cells through the bit lines and electrically connect or block adjacent sensing node lines in response to a pass control signal; and a control circuit configured to suspend a program operation, and while the program operation is suspended, move first data corresponding to a first state sensed through a first sensing node line in a first sensing latch of a first page buffer unit to a second sensing node line of a second page buffer unit during a cache read operation, and to control the page buffer circuit such that the first sensing latch performs an on-chip valley search (OVS) for reading a second state of the first sensing node line, wherein, while the program operation is suspended, the plurality of page buffer units are occupied by write data of the program operation.

9. The device of claim 8, wherein each of the plurality of page buffer units includes at least one pass transistor configured to, in response to the pass control signal, electrically connect or block an adjacent sensing node line of an adjacent page buffer unit.

10. The device of claim 9, wherein the first data is moved to sensing node lines of at least two page buffer units including the second page buffer unit.

11. The device of claim 10, wherein the at least two page buffer units correspond to an unused page buffer unit during the OVS for reading the second state.

12. The device of claim 9, wherein a level of the pass control signal is greater than or equal to a sum of an internal power supply voltage and a threshold voltage of the corresponding at least one pass transistor.

13. The device of claim 8, wherein the first data corresponds to fine sensed data under a bias condition determined based on a result of a prior OVS for reading the first state.

14. The device of claim 8, wherein the control circuit is configured to control the page buffer circuit to return the first data from the second sensing node line to the first sensing latch when the first sensing latch completes the on-chip valley search for reading the second state.

15. The device of claim 8, wherein the page buffer circuit includes:

a plurality of cache units configured to transfer sensing data, sensed during the OVS, of each of the plurality of page buffer units to an output terminal; and a page buffer decoder configured to provide data sensed by the first sensing latch from the OVS to a wired OR terminal.

16. The device of claim 15, wherein the first page buffer unit includes:

a first pass transistor configured to connect the first sensing node line to the second sensing node line in response to the pass control signal; and a second pass transistor configured to connect the first sensing node line to the wired or terminal in response to a common pass control signal.

17. A cache read method of a nonvolatile memory device, comprising:

initiating a program suspend period by suspending a program operation;

storing first data in a sensing latch of a first page buffer unit of a plurality of buffer units, the first data sensed from a selected memory cell;

transferring, during the program suspend period, the first data from the sensing latch of the first page buffer unit to a sensing node line of a second page buffer unit of the plurality of buffer units; and performing an on-chip valley search (OVS) on the selected memory cell using the sensing latch, wherein, during the program suspend period, the plurality of page buffer units are occupied by write data of a suspended program operation.

18. The method of claim 17, wherein the first data is data sensed under a bias condition set according to a result of a prior OVS for the selected memory cell.

19. The method of claim 17, wherein the second page buffer unit includes at least two page buffer units, and the sensing node line corresponds to a combined sensing node electrically connecting the sensing node lines of the at least two page buffer units.

20. The method of claim 17, further comprising:

transferring the first data dumped to the sensing node line to the sensing node line of the second page buffer unit after the OVS is completed.

* * * * *